US012757796B2

(12) United States Patent
Jin et al.

(10) Patent No.: US 12,757,796 B2
(45) Date of Patent: Oct. 6, 2026

(54) SEMICONDUCTOR PACKAGE AND METHOD OF MANUFACTURING THE SAME

(71) Applicant: SAMSUNG ELECTRONICS CO., LTD., Suwon-si (KR)

(72) Inventors: Jeonggi Jin, Suwon-si (KR); Gyuho Kang, Suwon-si (KR); Unbyoung Kang, Suwon-si (KR); Taehee Kim, Suwon-si (KR); Hyungjun Park, Suwon-si (KR)

(73) Assignee: Samsung Electronics Co., Ltd., Suwon-si (KR)

(*) Notice: Subject to any disclaimer, the term of this patent is extended or adjusted under 35 U.S.C. 154(b) by 360 days.

(21) Appl. No.: 18/614,964

(22) Filed: Mar. 25, 2024

(65) Prior Publication Data

US 2024/0387463 A1 Nov. 21, 2024

(30) Foreign Application Priority Data

May 19, 2023 (KR) ........................ 10-2023-0065133

(51) Int. Cl.
*H10W 90/00* (2026.01)
*H10W 70/685* (2026.01)
(Continued)

(52) U.S. Cl.
CPC ......... *H10W 90/00* (2026.01); *H10W 70/685* (2026.01); *H10W 74/121* (2026.01);
(Continued)

(58) Field of Classification Search
CPC . H10W 90/00; H10W 90/297; H10W 90/722; H10W 90/724; H10W 90/732; H10W 90/734; H10W 74/15; H10W 74/121; H10W 72/90; H10W 72/223; H10W 72/252; H10W 72/255; H10W 72/923; H10W 72/952; H10W 70/60; H10W 70/685; H10W 76/60;
(Continued)

(56) References Cited

U.S. PATENT DOCUMENTS 8,525,350 B2 9/2013 Pendse
8,592,995 B2 11/2013 Lin et al.
(Continued)

FOREIGN PATENT DOCUMENTS

KR 1025349 3/2011

*Primary Examiner* — Monica D Harrison
(74) *Attorney, Agent, or Firm* — Fish & Richardson P.C.

(57) ABSTRACT

A semiconductor package includes a semiconductor device including a substrate, bonding pads provided on a front surface of the substrate and bump structures provided on the bonding pads respectively, each of the bump structures having a metal pillar and a metal paste coated on one end portion of the metal pillar; and a wiring layer including a metal wiring layer having redistribution pads and a protective layer on the metal wiring layer and having recesses that expose at least portions of the redistribution pads. The semiconductor device is stacked on the wiring layer via the bump structures. Portions of the bump structures are respectively disposed in the recesses of the protective layer, and the metal pastes are respectively bonded to the redistribution pads.

20 Claims, 34 Drawing Sheets

(51) Int. Cl.

| | |
|---|---|
| ***H10W 74/10*** | (2026.01) |
| ***H10W 74/15*** | (2026.01) |
| ***H10W 76/60*** | (2026.01) |
| *H10W 70/60* | (2026.01) |
| *H10W 72/20* | (2026.01) |
| *H10W 72/90* | (2026.01) |
| *H10W 90/20* | (2026.01) |

(52) U.S. Cl.
CPC ............ *H10W 76/60* (2026.01); *H10W 70/60* (2026.01); *H10W 72/223* (2026.01); *H10W 72/252* (2026.01); *H10W 72/255* (2026.01); *H10W 72/90* (2026.01); *H10W 72/923* (2026.01); *H10W 72/952* (2026.01); *H10W 74/15* (2026.01); *H10W 90/297* (2026.01); *H10W 90/722* (2026.01); *H10W 90/724* (2026.01); *H10W 90/732* (2026.01); *H10W 90/734* (2026.01)

(58) Field of Classification Search
CPC ............. H10W 74/117; H10W 90/701; H10W 72/07254; H10W 72/352; H10W 72/823; H10W 70/65; H10W 20/20; H10W 20/40; H10W 20/42; H10W 20/427; H10W 20/435; H10W 70/614; H10W 72/07253; H10W 72/20; H10W 72/30
USPC .......................................................... 257/734
See application file for complete search history.

(56) References Cited

U.S. PATENT DOCUMENTS

| | | | | |
|---|---|---|---|---|
| 8,794,502 | B2 | 8/2014 | Eom et al. | |
| 9,040,349 | B2 | 5/2015 | Kelly et al. | |
| 9,515,006 | B2 | 12/2016 | Reber et al. | |
| 2016/0365329 | A1 | 12/2016 | Graf et al. | |
| 2017/0053898 | A1 * | 2/2017 | Yeh ........................ | H10W 90/00 |
| 2021/0125933 | A1 | 4/2021 | Chen et al. | |
| 2023/0197683 | A1 * | 6/2023 | Kim .................... | H10W 70/611 257/668 |

* cited by examiner

SEMICONDUCTOR PACKAGE AND METHOD OF MANUFACTURING THE SAME

CROSS REFERENCE TO RELATED APPLICATION

This application claims priority under 35 U.S.C. § 119 to Korean Patent Application No. 10-2023-0065133, filed on May 19, 2023, in the Korean Intellectual Property Office (KIPO), the contents of which are herein incorporated by reference in their entirety.

TECHNICAL FIELD

The present disclosure relates to a semiconductor package and a method of manufacturing the semiconductor package. More particularly, the present disclosure relates to a semiconductor package including a semiconductor chip stacked via bump structures and a method of manufacturing the same.

BACKGROUND

In manufacturing a semiconductor package, a semiconductor chips may be stacked on a wafer or a redistribution wiring layer using solder bumps. Solder bumps tend to be bonded to a pad or a redistribution wiring containing copper, so an intermetallic compound (IMC) may formed. As a result, deterioration may occur due to thermal requirements in subsequent processes. Further, there is a limit to reducing a joint gap due to heights of the solder bumps.

SUMMARY

The present disclosure provides a semiconductor package including bump structures capable of improving electrical and mechanical reliability and reducing an overall thickness.

The present disclosure also provides a method of manufacturing the semiconductor package.

In general, aspects of the subject matter described in this specification can be embodied in a semiconductor package including: a semiconductor device including a substrate, bonding pads provided on a front surface of the substrate and bump structures provided on the bonding pads respectively, each of the bump structures having a metal pillar and a metal paste coated on one end portion of the metal pillar; and a wiring layer including a metal wiring layer having redistribution pads and a protective layer on the metal wiring layer and having recesses that expose at least portions of the redistribution pads. The semiconductor device is stacked on the wiring layer via the bump structures. Portions of the bump structures are respectively disposed in the recesses of the protective layer, and the metal paste is bonded to the redistribution pad.

Another general aspect can be embodied in a semiconductor package including: a first semiconductor chip including a first substrate, redistribution pads provided on a first surface of the first substrate and a protective layer having recesses that expose at least portions of the redistribution pads; a second semiconductor chip stacked on the first semiconductor chip, the second semiconductor chip including a second substrate and chip pads provided on a first surface of the second substrate; and a plurality of bump structures interposed between the first semiconductor chip and the second semiconductor chip. Each of the bump structures includes a metal pillar provided on the chip pad of the second semiconductor chip, and a metal paste coated on one end portion of the metal pillar. The metal paste is bonded to the redistribution pad.

Another general aspect can be embodied in a semiconductor package including: a lower redistribution wiring layer including first redistribution wirings stacked in at least two layers; a semiconductor chip disposed on the lower redistribution wiring layer and electrically connected to the first redistribution wirings; a plurality of bump structures interposed between the lower redistribution wiring layer and the semiconductor chip; a sealing member covering the semiconductor chip on the lower redistribution wiring layer; a plurality of through vias penetrating the sealing member and electrically connected to the first redistribution wirings; and an upper redistribution wiring layer disposed on the sealing member and including second redistribution wirings electrically connected to the plurality of through vias. The lower redistribution wiring layer includes an uppermost insulating layer having recesses that expose at least portions of uppermost redistribution wirings among the first redistribution wirings. Each of the bump structures includes a metal pillar provided on a chip pad of the semiconductor chip and a metal paste coated on one end portion of the metal pillar. The metal paste is bonded to the uppermost redistribution wiring of the first redistribution wirings.

Another general aspect can be embodied in a semiconductor package including: a second semiconductor chip stacked on a first semiconductor chip or a redistribution wiring layer via bump structures. Each of the bump structures may include a metal pillar provided on a chip pad of the second semiconductor chip and a metal paste coated on one end portion of the metal pillar.

The metal paste may be a copper paste containing copper. The metal paste may be bonded to a redistribution pad of the first semiconductor chip or an uppermost redistribution wiring of the redistribution wiring layer by a sintering process. At least a portion of the metal paste covering the end portion of the metal pillar may be accommodated in a recess of a protective layer that exposes at least a portion of the redistribution pad or the uppermost redistribution wiring.

Since the copper pillar is bonded to the redistribution pad (redistribution wiring) containing by the copper paste, the formation of an intermetallic compound (IMC) between the redistribution pad (redistribution wiring) containing copper and the solder layer may be prevented or suppressed. Additionally, since one end portion of the bump structure is disposed within the recess of the protective layer, a joint gap may be reduced. Thus, the electrical and mechanical reliability of the semiconductor package may be improved and the overall thickness may be reduced.

DETAILED DESCRIPTION

Figure 1:
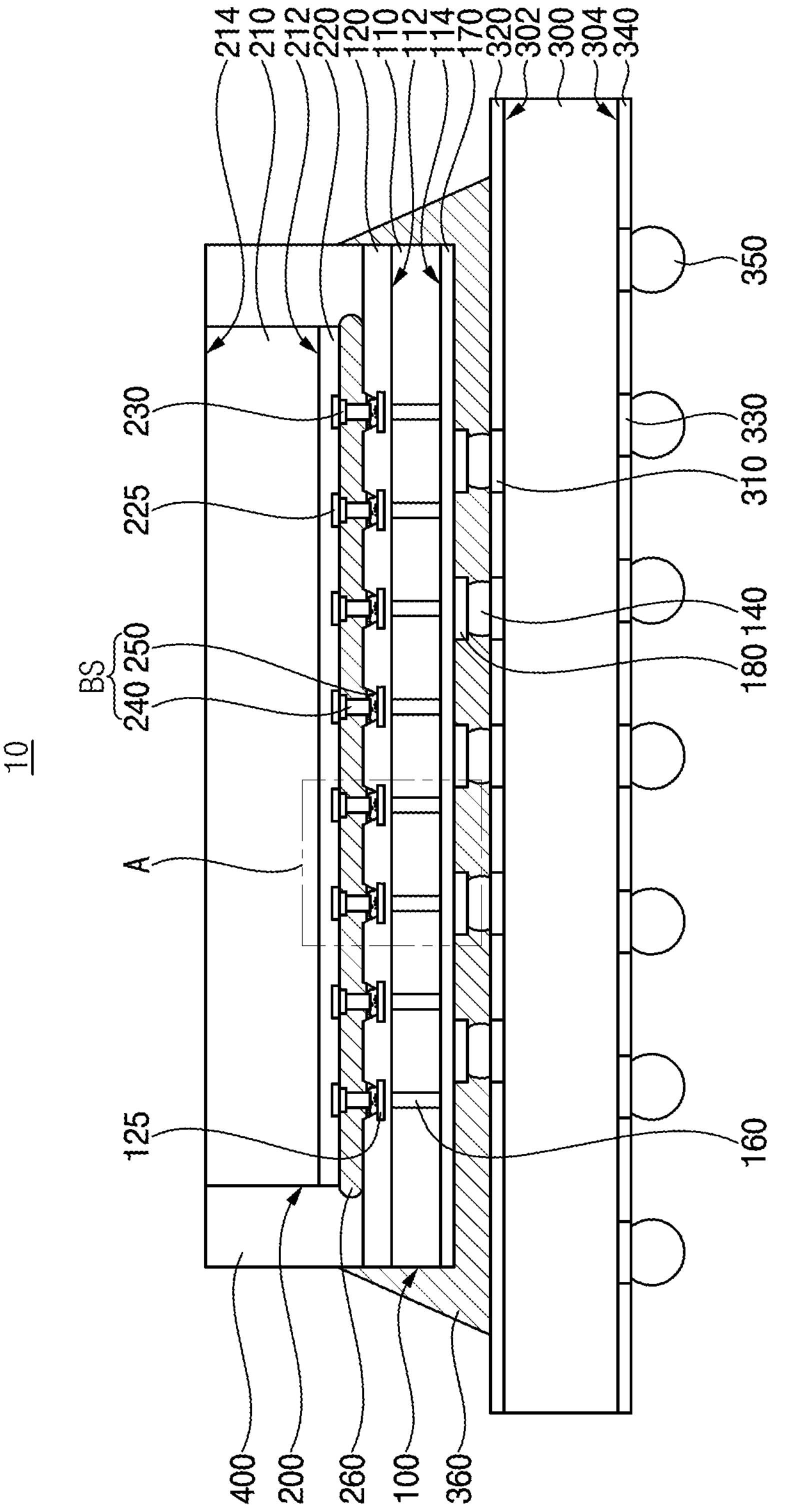
FIG. 1 is a cross-sectional view illustrating an example of a semiconductor package.
Figure 2:
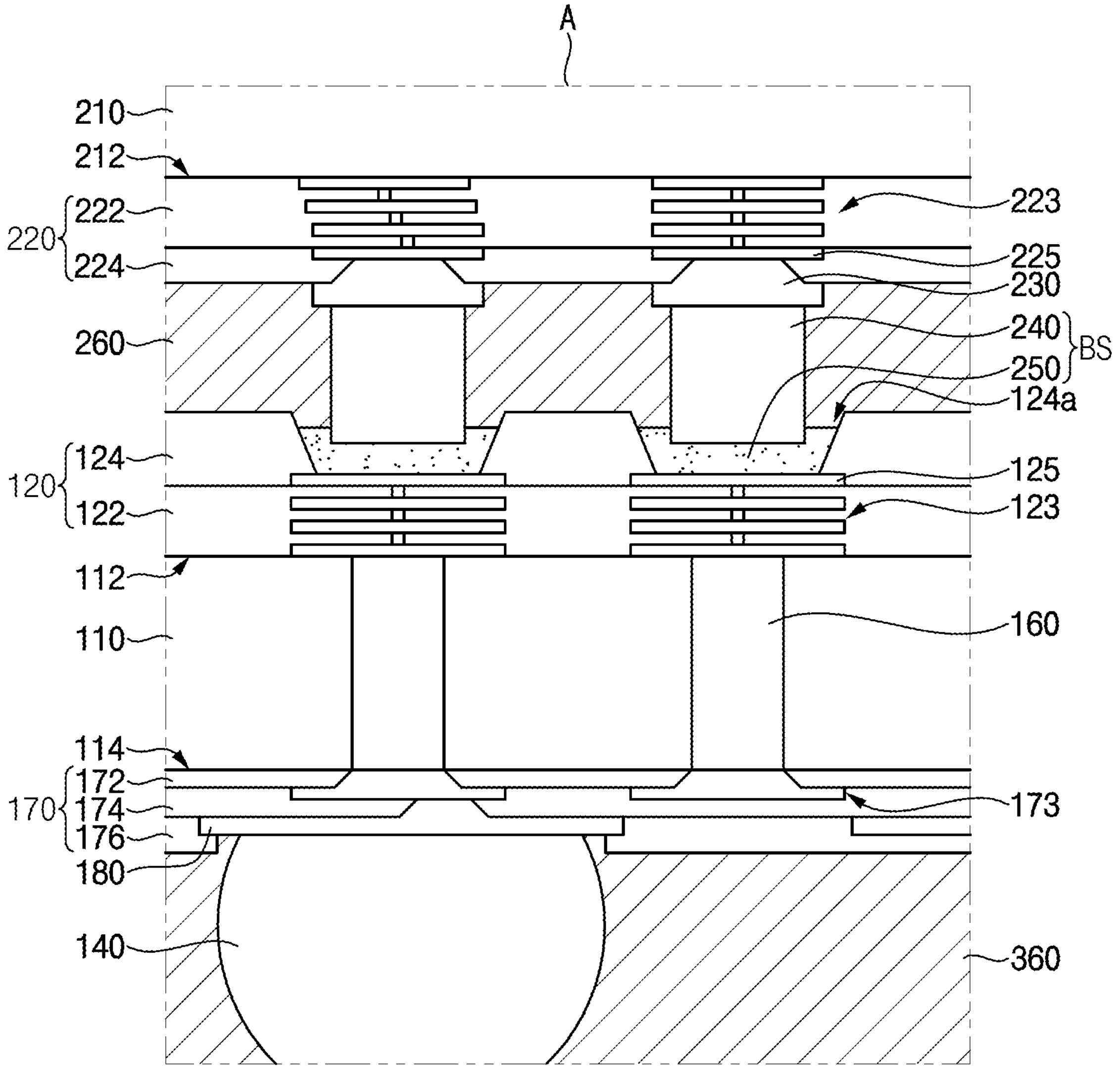
FIG. 2 is an enlarged cross-sectional view illustrating portion 'A' in FIG. 1.

FIG. 1 is a cross-sectional view illustrating an example of a semiconductor package. FIG. 2 is an enlarged cross-sectional view illustrating portion 'A' in FIG. 1.

Referring to FIGS. 1 and 2, a semiconductor package 10 may include a first semiconductor chip 100, a second semiconductor chip 200 stacked on the first semiconductor chip 100, and bump structures BS interposed between the first and second semiconductor chips 100 and 200. In addition, the semiconductor package 10 may further include a sealing member 400, a package substrate 300 on which the stacked first and second semiconductor chips 100 and 200 are mounted, and outer connection members 350 provided on a lower surface of the package substrate 300.

In addition, the semiconductor package 10 may be a multi-chip package (MCP) including different types of semiconductor chips. The semiconductor package 10 may be a system in package (SIP) including a plurality of semiconductor chips stacked or arranged in one package to perform all or most of the functions of an electronic system.

The semiconductor package 10 may include the first semiconductor chip 100 as a first substrate structure and the second semiconductor chips 200 as a second substrate structure, sequentially stacked. One of the first semiconductor chip 100 and the second semiconductor chip 200 may be a logic chip including a logic circuit, and the other may be a memory chip or a sensor chip. The logic chip may be a controller that controls memory elements of the memory chip. For example, the logic chip may be a processor chip such as an ASIC, an application processor (AP), and the like. serving as a host such as a CPU, GPU, or SOC. The memory chip may include DRAM, SRAM, and the like. The sensor chip may be a CMOS image sensor chip.

In this example, the semiconductor package as a multi-chip package is illustrated as including two stacked first and second semiconductor chips 100 and 200. However, it is not limited thereto, and for example, the semiconductor package may include 4, 8, 12, or 16 stacked semiconductor chips.

In some implementations, the first semiconductor chip 100 may include a first substrate 110, a first wiring layer 120, a plurality of through electrodes 160 and a plurality of first bonding pads 180. In addition, the first semiconductor chip 100 may further include conductive bumps 140 as conductive connection members respectively provided on the first bonding pads 180. The first semiconductor chip 100 may be mounted on the package substrate 300 via the conductive bumps 140. For example, the conductive bumps 140 may include solder bumps.

The first substrate 110 may have a first surface 112 and a second surface 114 opposite to each other. The first surface may be an active surface, and the second surface may be an inactive surface. Circuit patterns and cells may be formed on the first surface 112 of the first substrate 110. For example, the first substrate 110 may be a single crystal silicon substrate. The circuit patterns may include transistors, capacitors, diodes, and the like. The circuit patterns may constitute circuit elements. Accordingly, the first semiconductor chip 100 may be a semiconductor device in which a plurality of the circuit elements is formed.

The first wiring layer 120 may be provided on the first surface 112 of the first substrate 110, that is, the active surface. The first wiring layer 120 may include a metal wiring layer 122 and a protective layer 124 sequentially stacked on the first substrate 110. The metal wiring layer 122 may include a plurality of insulating layers, upper wirings 123 in the insulating layers, and redistribution pads 125 as uppermost wirings. The redistribution pad 125 may be provided in an outermost insulating layer of the first wiring layer 120.

The protective layer 124 may be provided on the metal wiring layer 122. The protective layer 124 may include a recess **124*a* that exposes at least a portion of the redistribution pad 125. An upper surface of the redistribution pad 125 may be exposed through a bottom face of the recess 124*a***.

The through electrode 160 in the form of a through silicon via (TSV) may be provided to vertically penetrate the first substrate 110 from the first surface 112 to the second surface 114 of the first substrate 110. A first end portion of the through electrode 160 may contact the upper wiring of the first wiring layer. However, it is not limited thereto, and for example, the through electrode 160 may extend through the first wiring layer and may directly contact the redistribution pad 125.

A first backside insulation layer 170 may be provided on the second surface 114 of the first substrate 110, that is, the backside surface. The first bonding pads 180 may be provided in the first backside insulation layer 170. The first bonding pad 130 may be electrically connected to the through electrode 160 by wirings of the first backside insulation layer 170.

In particular, the first backside insulating layer 170 may include first and second insulating layers 172 and 174 sequentially stacked on each other and wirings 173 provided in the first and second insulating layers. The first insulating layer 172 may be provided on the second surface 114 of the first substrate 110 and may have first openings that expose lower surfaces of the through electrodes 160. The wirings 173 may be provided on the first insulating layer 172 and may be electrically connected to the through electrodes 160 through the first openings of the first insulating layer 172. The second insulating layer 174 may be provided on the first insulating layer 172 to cover the wirings 173, and the second insulating layer 174 may have second openings that expose at least portions of the wirings 173.

The first bonding pads 180 may be provided on the second insulating layer 174 and may be electrically connected to the wirings 173 through the second openings of the second insulating layer 174. A third insulating layer 176 may be provided on the second insulating layer 174 as a passivation layer to expose at least portions of the first bonding pads 180.

Accordingly, the through electrode 160 may be electrically connected to the first bonding pad 180 by the wirings 173. Thus, the redistribution pad 125 and the first bonding pad 180 may be electrically connected to each other through the through electrode 160.

In some implementations, the second semiconductor chip 200 may include a second substrate 210, a second wiring layer 220 and a plurality of second bonding pads 230. In addition, the second semiconductor chip 200 may further include bump structures BS as conductive connection members respectively provided on the second bonding pads 230. The second semiconductor chip 200 may be mounted on the first semiconductor chip 100 via the bump structures BS.

In particular, the second substrate 210 may have a first surface 212 and a second surface 214 opposite to each other. The first surface may be an active surface, and the second surface may be an inactive surface. Circuit elements may be formed on the first surface 212 of the second substrate 210. The second semiconductor chip may be a logic chip including a logic circuit or a memory chip including a plurality of memory elements. An insulation interlayer covering the circuit elements may be formed on the first surface 212 of the second substrate 210.

The second wiring layer 220 may include a metal wiring layer 222 and a protective layer 224 sequentially stacked on the first surface 212 of the second substrate 210. The metal wiring layer 222 may include a plurality of insulating layers, upper wirings 223 in the insulating layers, and redistribution pads 225 as uppermost wirings. The protective layer 224 may be formed on the metal wiring layer 222 and may cover the redistribution pads 225.

The redistribution pads 225 may be electrically connected to the circuit elements through the upper wirings 223 and contact plugs in the insulation interlayer. The second bonding pad 230 may be provided on at least a portion of the redistribution pad 225. The second bonding pad 230 may be electrically connected to the redistribution pad 225. The second bonding pads 230 may be referred to as chip pads of the second semiconductor chip 200.

The sizes and thicknesses of the first and second semiconductor chips, the number, size, arrangement, and the like. of the insulating layers of the wiring layer, the upper wirings and the redistribution pads are provided as examples, and it will be understood that it is not limited thereto.

In some implementations, each of the bump structures BS may include a metal pillar 240 provided on the second bonding pad 230 and a metal paste 250 coated on one end portion of the metal pillar 240.

The metal pillar 240 may include, for example, copper (Cu), copper alloy, nickel (Ni), nickel alloy, palladium (Pd), platinum (Pt), gold (Au), cobalt (Co), and a combination thereof. In this example, the metal pillar 240 may include copper (Cu). The metal pillar 240 may have a diameter D1 within a range of 5 μm to 50 μm. The metal pillar 240 may be formed on the second bonding pad 230 through a plating process. A metal layer may be provided between the metal pillar 240 and the second bonding pad 230. The metal layer may include a seed layer, an adhesive layer or a barrier layer for forming the metal pillar 240. For example, the metal layer may be chromium (Cr), tungsten (W), titanium (Ti), copper (Cu), nickel (Ni), aluminum (Al), palladium (Pd), gold (Au), or a combination thereof.

The metal paste 250 may be provided to cover the end portion of the metal pillar 240. The metal paste 250 may be a copper paste containing copper. The metal paste 250 may include a copper powder and a paste flux. The metal paste 250 may include a copper powder of 10 wt % to 95 wt % based on the total weight of the metal paste and a paste flux of the remaining wt %. The paste flux may include a binder for fixing the copper powder, a solvent for controlling viscosity, and an activator for removing an oxidation layer of the copper powder and preventing re-oxidation during a bump formation process.

The metal paste 250 may be bonded to the redistribution pad 125 of the first wiring layer 120 of the first semiconductor chip 100 by a sintering process. Accordingly, the metal pillar 240 may be bonded to the redistribution pad 125 by the metal paste 250.

The protective layer 124 may include a recess 124*a* that exposes at least a portion of the redistribution pad 125. The recess 124*a* may have a diameter D2 that is greater than a diameter D1 of the metal pillar 240. The diameter D2 of the recess 124*a* may be within a range of 8 μm to 60 μm. The recess 124*a* may have a depth T within a range of 3 μm to 10 μm from an upper surface of the protective layer 124. The recess 124*a* may have an inner wall inclined at a predetermined angle with respect to the upper surface of the protective layer 124.

The recess 124*a* may accommodate the end portion of the bump structure BS that is formed on the second bonding pad 230 of the second semiconductor chip 200. At least a portion of the metal paste 250 covering the end portion of the metal pillar 240 may be accommodated in the recess 124*a*.

Since the metal pillar 240, e.g., a copper pillar, is bonded to the redistribution pad 125 by the metal paste 250, e.g., copper paste, the formation of an intermetallic compound (IMC) between the redistribution pad 125 containing copper and the solder layer may be prevented or suppressed. Additionally, since the end portion of the bump structure BS is disposed within the recess 124*a* of the protective layer 124, a joint gap G between the first semiconductor chip 100 and the second semiconductor chip 200 may be reduced.

Accordingly, the second bonding pad 230 of the second semiconductor chip 200 may be electrically connected to the redistribution pad 125 of the first semiconductor chip 100 by the bump structure BS.

In this example, a bonding pad may not be provided on the redistribution pad 125 of the first semiconductor chip 100. However, the present inventive concept is not limited thereto, and for example, a bonding pad may be provided on the redistribution pad 125 and the protective layer may have a recess that exposes at least a portion of the bonding pad. In this case, the bump structure may be bonded to the bonding pad on the redistribution pad.

In some implementations, an adhesive layer 260 may be provided to fill a space between the bump structures BS between the first semiconductor chip 100 and the second semiconductor chip 200. For example, the adhesive layer may include a non-conductive film (NCF).

For example, the second semiconductor chip 200 and the first semiconductor chip 100 may be attached to each other by a thermal compression process using the non-conductive film. In the thermal compression process, the non-conductive film may be liquefied and have fluidity, and may flow between the bump structures BS between the second semiconductor chip 200 and the first semiconductor chip 100, and then may be cured to fill the space between the bump structures BS. A portion of the cured adhesive layer 260 may protrude from a side surface of the second semiconductor chip 200.

Alternatively, after the second semiconductor chip 200 is stacked on the first semiconductor chip 100 via the bump structures BS, the adhesive layer 260 may be underfilled between the first semiconductor chip 100 and the second semiconductor chip 200. For example, the adhesive layer may include an epoxy material to reinforce the gap between the second semiconductor chip 200 and the first semiconductor chip 100.

In some implementations, the sealing member 400 may cover the second semiconductor chip 200 on the first semiconductor chip 100. The sealing member 400 may cover the side surface of the second semiconductor chip 200. An upper surface of the second semiconductor chip 200, that is, a backside surface may be exposed by the sealing member 400. For example, the sealing member 400 may include a thermosetting resin or the like.

In some implementations, the package substrate 300 may be a substrate having an upper surface 302 and a lower surface 304 opposite to each other. For example, the package substrate 300 may be a printed circuit board (PCB). The printed circuit board may be a multilayer circuit board having vias and various circuits therein.

The first semiconductor chip 100 may be mounted on the package substrate 300 via the conductive bumps 140. The first surface 112 of the first substrate 110 of the first semiconductor chip 100 may face the package substrate 300. The conductive bump 140 of the first semiconductor chip 100 may be bonded to a substrate pad 310 on the upper surface 302 of the package substrate 300. A planar area of the first semiconductor chip 100 may be smaller than a planar area of the package substrate 300. When viewed from a plan view, the first semiconductor chip 100 may be disposed within the package substrate 300.

In some implementations, an underfill member 360 may be interposed between the first semiconductor chip 100 and the package substrate 300. For example, the underfill member may include an epoxy material to reinforce a gap between the first semiconductor chip 100 and the package substrate 300.

Outer connection pads 330 may be provided on the lower surface 304 of the package substrate 300, and the outer connection members 350 may be respectively disposed on the outer connection pads 330. For example, the outer connection member 350 may be a solder ball. The semiconductor package 10 may be mounted on a module substrate via the solder balls to form a memory module.

As mentioned above, the semiconductor package 10 may include the first semiconductor chip 100, the second semiconductor chip 200 stacked on the first semiconductor chip 100 via the bump structures BS. Each of the bump structures BS may include the metal pillar 240 provided on the second bonding pad 230 of the second semiconductor chip 200 and the metal paste 250 coated on the end portion of the metal pillar 240.

The metal paste 250 may be provided to cover the end portion of the metal pillar 240. The metal paste 250 may be a copper paste containing copper. The metal paste 250 may be bonded to the redistribution pad 125 of the first semiconductor chip 100 by a sintering process. Accordingly, the metal pillar 240 may be bonded to the redistribution pad 125 using the metal paste 250. At least a portion of the metal paste 250 covering the end portion of the metal pillar 240 may be accommodated in the recess **124*a* of the protective layer 124 that exposes at least a portion of the redistribution pad 125**.

Since the metal pillar 240, e.g., a copper pillar, is bonded to the redistribution pad 125 by the metal paste 250, e.g., copper paste, the formation of an intermetallic compound (IMC) between the redistribution pad 125 containing copper and the solder layer may be prevented or suppressed. Additionally, since one end portion of the bump structure BS is disposed within the recess **124*a* of the protective layer 124, the joint gap G between the first semiconductor chip 100 and the second semiconductor chip 200 may be reduced. Thus, the electrical and mechanical reliability of the semiconductor package 10** may be improved and the overall thickness may be reduced.

Hereinafter, a method of manufacturing the semiconductor package of FIG. 1 will be described.

FIGS. 3 to 16 are views illustrating an example of a method of manufacturing a semiconductor package. FIG. 4 is an enlarged cross-sectional view illustrating portion 'B' in FIG. 3. FIG. 6 is an enlarged cross-sectional view illustrating portion 'C' in FIG. 5. FIG. 8 is an enlarged cross-sectional view illustrating portion 'D' in FIG. 7. FIG. 11 is an enlarged cross-sectional view illustrating portion 'E' in FIG. 10. FIG. 13 is an enlarged cross-sectional view illustrating portion 'F' in FIG. 12.

Figure 3:
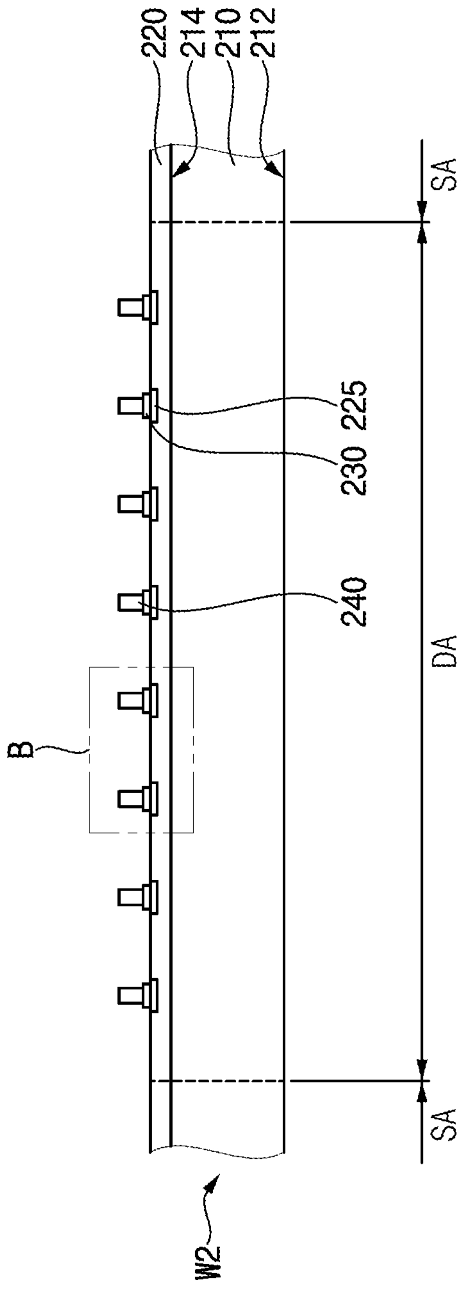
FIGS. 3 to 16 are views illustrating an example of a method of manufacturing a semiconductor package.
Figure 4:
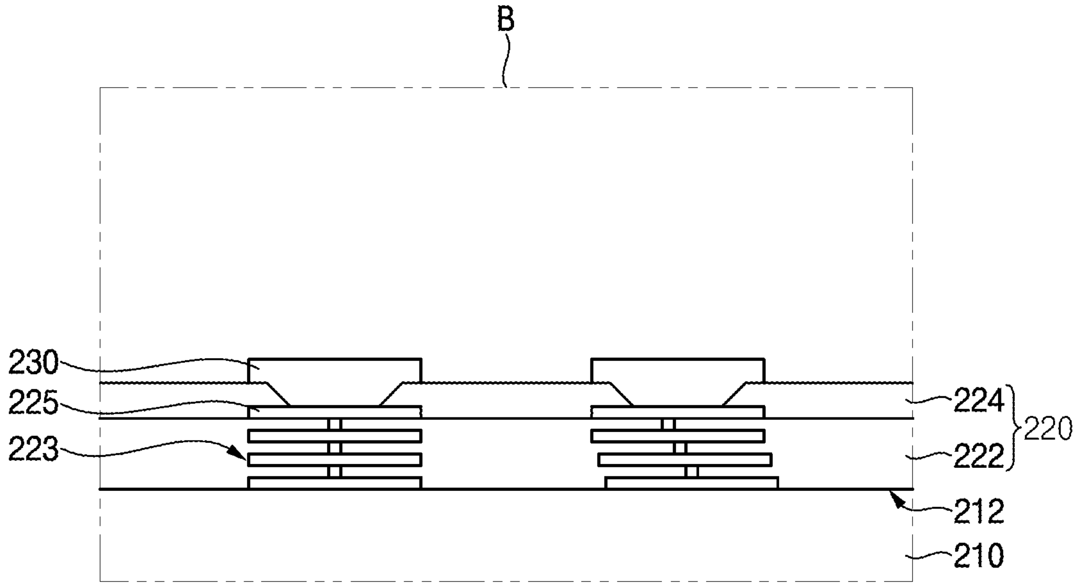

Referring to FIGS. 3 and 4, a second wafer W2 including a plurality of second semiconductor chips (dies) are formed therein may be provided.

In some implementations, the second wafer W2 may include a second substrate 210 having a first surface 212 and a second surface 214 opposite to the first surface 212. The second substrate 210 may include a die region DA and a scribe lane region SA surrounding the die region DA. The second substrate 210 may be cut along the scribe lane region SA that divides the plurality of die regions DA of the second wafer W2 by a following sawing process to be individualized into a plurality of second semiconductor chips.

Circuit elements may be formed in the die region DA on the first surface 212 of the second substrate 210. The second semiconductor chip may be a logic chip including a logic circuit or a memory chip including a plurality of memory elements.

For example, the second substrate 210 may include silicon, germanium, silicon-germanium, or III-V compounds, e.g., GaP, GaAs, GaSb, and the like. In some implementations, the second substrate 210 may be a silicon-on-insulator (SOI) substrate, or a germanium-on-insulator (GOI) substrate.

The circuit elements may include, for example, transistors, capacitors, wiring structures, and the like. The circuit elements may be formed on the first surface 212 of the second substrate 210 by performing a Fab process called a Front End of Line (FEOL) process for manufacturing semiconductor devices. A surface of the second substrate on which the FEOL process is performed may be referred to as a front side surface of the second substrate, and a surface opposite to the front side surface may be referred to as a backside surface. An insulation interlayer covering the circuit elements may be formed on the first surface 212 of the second substrate 210.

In some implementations, the second wafer W2 may include a second wiring layer 220 provided on the second substrate 210. The second wiring layer 220 may include a metal wiring layer 222 and a protective layer 224 sequentially stacked on the second substrate 210. The second wiring layer may be formed by performing a wiring process called a back-end-of-line (BEOL) process. The second substrate 210 on which the second wiring layer 220 is formed may be referred to as a second substrate structure.

The metal wiring layer 222 may include a plurality of insulating layers, upper wirings 223 in the insulating layers, and redistribution pads 225 as uppermost wirings. The protective layer 224 may be formed on the metal wiring layer 222 and may cover the redistribution pads 225. The redistribution pads 225 may be electrically connected to the circuit elements through the upper wirings 223 and contact plugs in the insulation interlayer.

For example, the insulating layers may be formed of an oxide such as silicon oxide, carbon-doped oxide, or fluorine-doped oxide. The protective layer may include a passivation layer including a nitride such as silicon nitride (SiN). In addition, the passivation layer may include an organic passivation layer including an oxide layer and an inorganic passivation layer including a nitride layer, sequentially stacked. The upper wirings and the redistribution pads may include a metal material such as aluminum (Al) or copper (Cu).

A second bonding pad 230 may be formed on at least a portion of the redistribution pad 225 to be electrically connected to an external device. The second bonding pad 230 may be referred to as a chip pad of the second semiconductor chip. As will be described below, a bump structure including a metal pillar may be formed on the second bonding pad 230, and the second substrate structure may be stacked on a first substrate structure using the bump structure.

For example, a photoresist layer may be formed on the protective layer 224, an exposure process may be performed to form a photoresist pattern having openings that expose portions of the protective layer 224, and the photoresist pattern may be used as an etching mask to partially remove the protective layer 224 such that portions of the redistribution pads 225 are exposed.

Then, the second bonding pads 230 may be formed on the exposed portions of the redistribution pads 225. The second bonding pads 230 may be formed by a plating process. For example, the second bonding pad 230 may be formed of copper (Cu), aluminum (Al), tungsten, nickel (Ni), molybdenum (Mo), gold (Au), or silver (Ag), chromium (Cr), tin (Sn), titanium (Ti), and the like.

In some implementations, a plating layer may be formed on the second bonding pad 230. The plating layer may include a metal different from that of the second bonding pad.

The number, size, arrangement, and the like. Of the insulating layers, the upper wirings and the redistribution pads are provided as examples, and it will be understood that it is not limited thereto.

Figure 5:
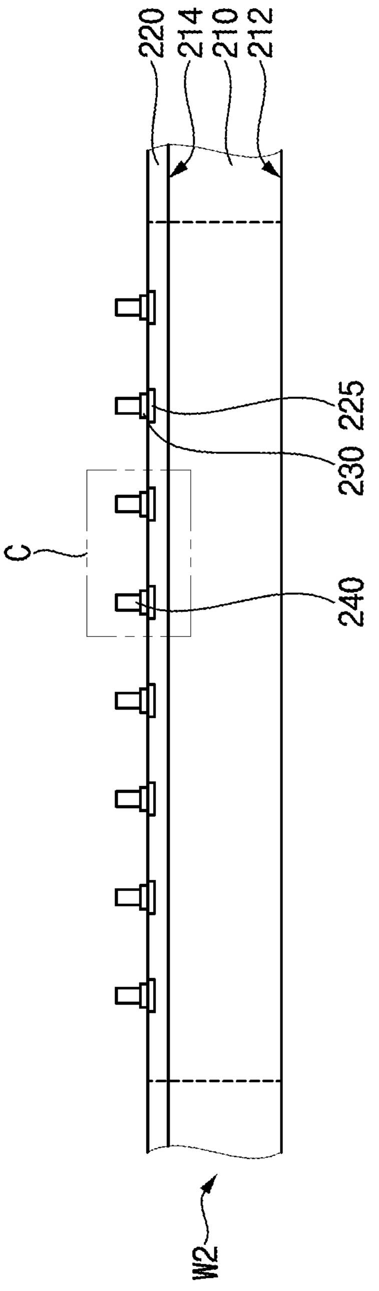
Figure 6:
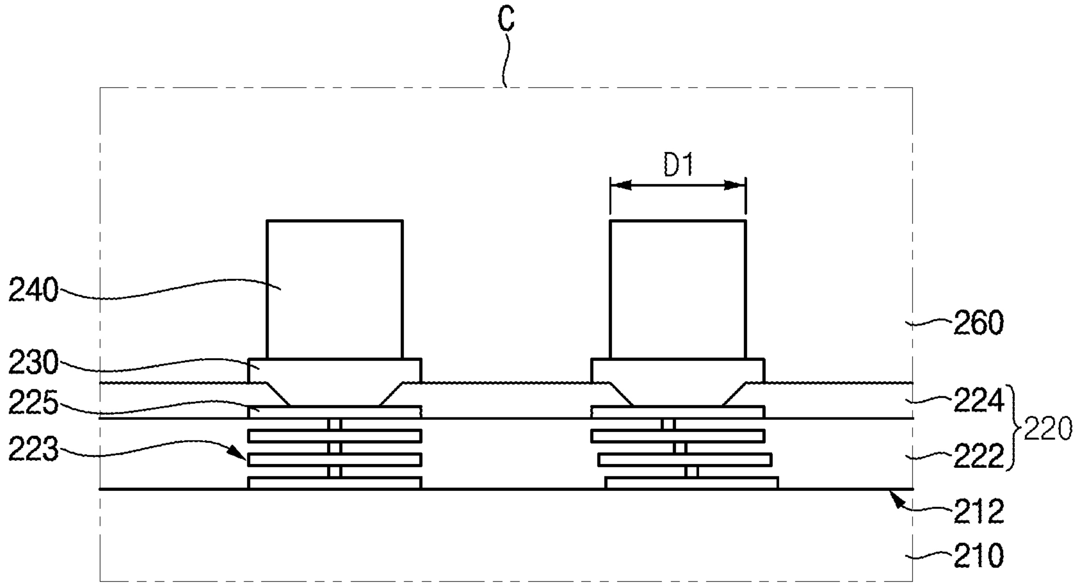

Referring to FIGS. 5 and 6, metal pillars 240 may be formed on the second bonding pads 230, respectively.

In some implementations, the metal pillars 240 may be formed simultaneously by a plating process. In particular, a seed layer may be formed on the second bonding pads 230 on the second wiring layer 124, a photoresist pattern having openings that expose portions of the seed layer may be formed on the seed layer, the openings of the photoresist pattern may be filled up with a conductive material, and the photoresist pattern may be removed to form the metal pillars. Alternatively, the metal pillars may be formed by a screen printing method, a deposition method, or another method.

The metal pillar 240 may include, for example, copper (Cu), copper alloy, nickel (Ni), nickel alloy, palladium (Pd), platinum (Pt), gold (Au), cobalt (Co), and a combination thereof. In this example, the metal pillar 240 may include copper (Cu). The metal pillar 240 may have a diameter D1 within a range of 5 μm to 50 μm.

Figure 7:
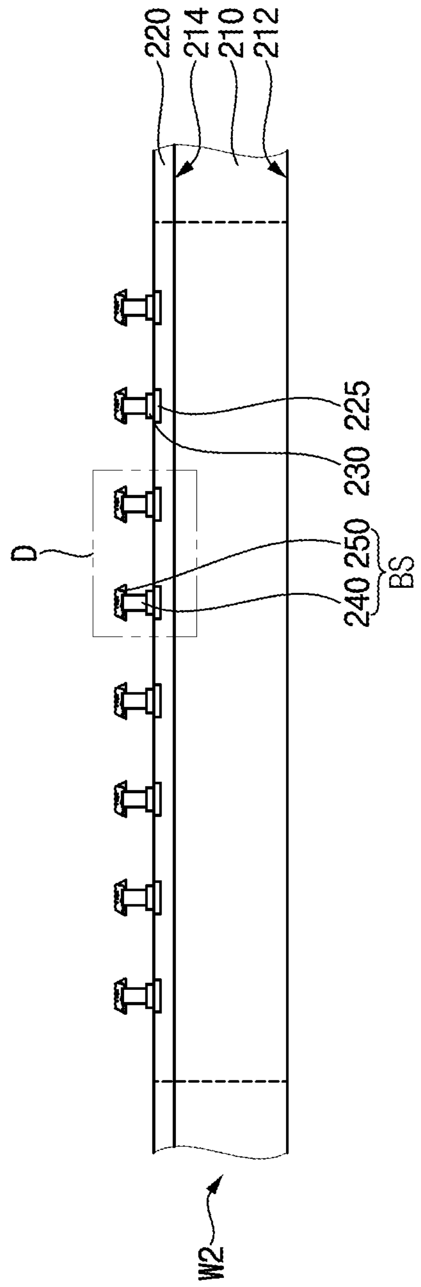
Figure 8:
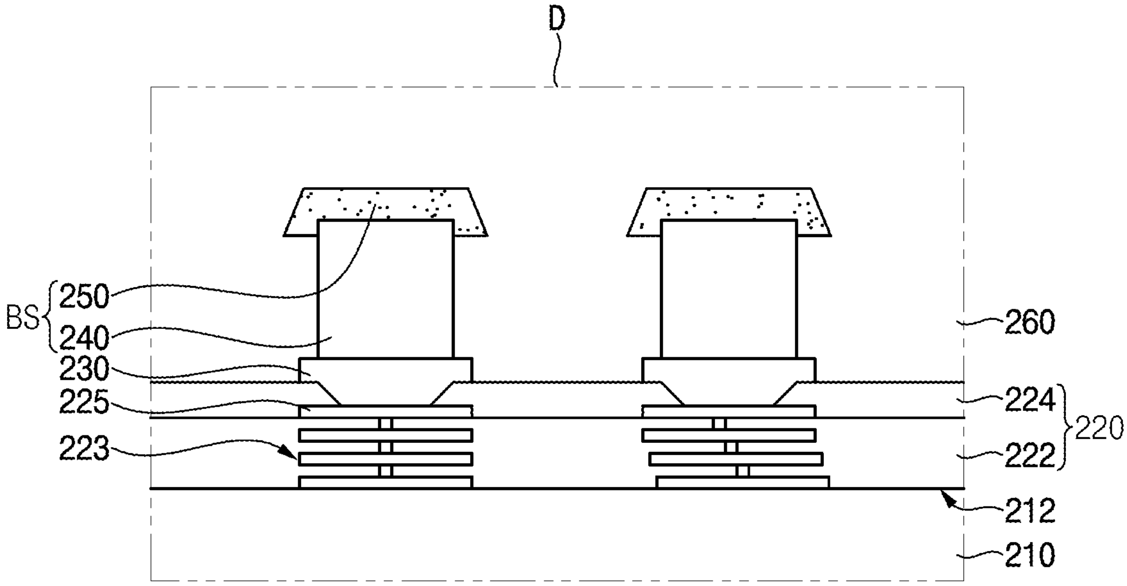

Referring to FIGS. 7 and 8, a metal paste 250 may be coated on an end portion of each of the metal pillars 240*a* to form bump structure BS.

In some implementations, the end portions of the metal pillars 240 may be dipped into a slurry-type metal paste accommodated within a receiving tank to deposit the metal paste 250 on the end portion of each metal pillar 240. For example, the metal paste 250 may be a copper paste containing copper. The metal paste 250 may include a copper powder and a paste flux. The metal paste 250 may include a copper powder of 10 wt % to 95 wt % and a paste flux of the remaining wt %, based on a total weight of the metal paste. The paste flux may include a binder for fixing the copper powder, a solvent for controlling viscosity, and an activator for removing an oxidation layer of the copper powder and preventing re-oxidation during a bump formation process.

Figure 9:
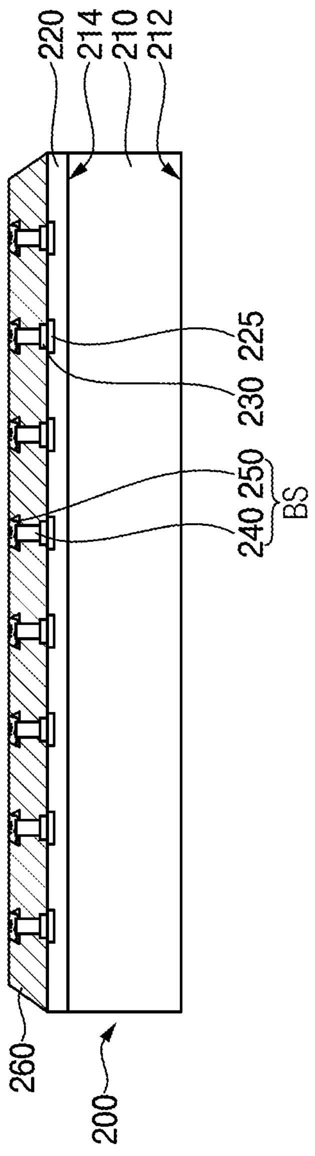

Referring to FIG. 9, the second wafer W2 may be cut along the scribe lane region SA to form an individualized second semiconductor chip 200. The second wafer W2 may be cut by a sawing process.

An adhesive layer 260 may be attached to the second semiconductor chip 200 in order to adhere the second semiconductor chip 200 to a first wafer, which will be described below. The adhesive layer 260 may be formed on the second wiring layer 220 to cover the bump structures BS. For example, the adhesive layer 260 may include a thermosetting resin. The adhesive layer 260 may include a non-conductive film (NCF).

In some implementations, the adhesive layer 260 may be formed on the second wiring layer 220 of the second wafer W2 before performing the sawing process.

Alternatively, the adhesive layer 260 may be formed on the first wafer on which the second semiconductor chip 200 is stacked, or may be formed as an underfill member after stacking the second semiconductor chip 200 on the first wafer W1.

Figure 10:
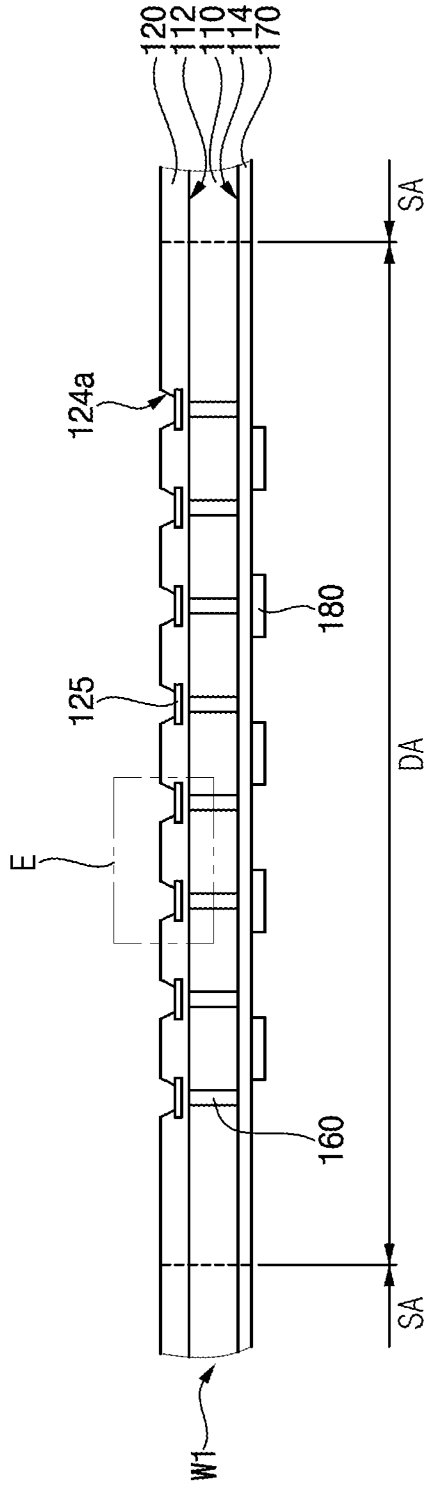
Figure 11:
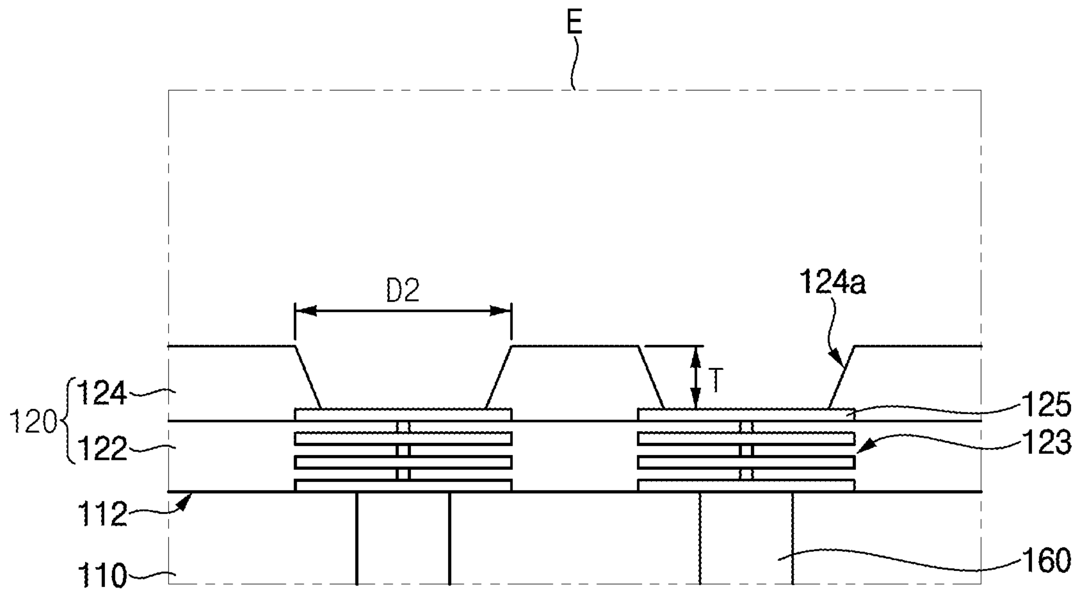

Referring to FIGS. 10 and 11, a first wafer W1 including a plurality of first semiconductor chips (dies) are formed therein may be provided.

In some implementations, the first wafer W1 may include a first substrate 110 having a first surface 112 and a second surface 114 opposite to the first surface 112. The first substrate 110 may include a die region DA and a scribe lane region SA surrounding the die region DA. The first substrate 110 may be cut along the scribe lane region SA that divides the plurality of die regions DA of the first wafer W1 by a following sawing process to be individualized into a plurality of first semiconductor chips.

Circuit elements may be formed in the die region DA on the first surface 112 of the first substrate 110. The first semiconductor chip may be a logic chip including a logic circuit or a memory chip including a plurality of memory elements.

The circuit elements may include, for example, transistors, capacitors, wiring structures, and the like. The circuit elements may be formed on the first surface 112 of the first substrate 110 by performing a Fab process, e.g., a front end of line (FEOL) process for manufacturing semiconductor devices. A surface of the first substrate on which the FEOL process is performed may be referred to as a front side surface of the first substrate, and a surface opposite to the front side surface may be referred to as a backside surface. An insulation interlayer covering the circuit elements may be formed on the first surface 112 of the first substrate 110.

The first wafer W1 may include a first wiring layer 120 provided on the first surface 112 of the first substrate 110. The first substrate 110 on which the first wiring layer 120 is formed may be referred to as a first substrate structure. The first wafer W1 may further include through electrodes 160 penetrating the first substrate 110 and first bonding pads 130 provided on the second surface 114 of the first substrate 110 and electrically connected to the through electrodes 160.

As illustrated in FIG. 11, the first wiring layer 120 may be provided on the first surface 112 of the first substrate 110, that is, an active surface. The first wiring layer 120 may include a metal wiring layer 122 and a protective layer 124 sequentially stacked on the first substrate 110. The first wiring layer may be formed by performing a wiring process called a back-end-of-line (BEOL) process.

The metal wiring layer 122 may include a plurality of insulating layers, upper wirings 123 in the insulating layers, and redistribution pads 125 as uppermost wirings. The redistribution pad 125 may be provided on an outermost insulating layer of the first wiring layer 120. The protective layer 124 may be formed on the metal wiring layer 122.

For example, the insulating layers may be formed of an oxide such as silicon oxide, carbon-doped oxide, or fluorine-doped oxide. The protective layer may include a passivation layer including a nitride such as silicon nitride (SiN). In addition, the passivation layer may include an organic passivation layer including an oxide layer and an inorganic passivation layer including a nitride layer, sequentially stacked. The upper wirings and the redistribution pads may include a metal material such as aluminum (Al) or copper (Cu).

The protective layer 124 may include a recess 124*a* that exposes at least a portion of the redistribution pad 125. An upper surface of the redistribution pad 125 may be exposed through a bottom face of the recess 124*a*. As will be described below, the recess 124*a* may accommodate an end portion of the bump structure BS that is formed on the second bonding pad 230 of the second semiconductor chip 200. The recess 124*a* may have a diameter D2 that is greater than a diameter D1 of the metal pillar 240. The diameter D2 of the recess 124*a* may be within a range of 8 μm to 60 μm. The recess 124*a* may have a depth T within a range of 3 m to 10 μm from an upper surface of the protective layer 124. The recess 124*a* may have an inner wall inclined at a predetermined angle with respect to the upper surface of the protective layer 124. The redistribution pads 125 exposed by the recesses 124*a* and the second bonding pads 230 of the second semiconductor chip 200 may be arranged in an array form, e.g., each redistribution pad 125 exposed by a recesses 124*a* is arranged below a corresponding second bonding pad 230.

The through electrode 160 in the form of a through silicon via (TSV) may be provided to vertically penetrate the first substrate 110 from the first surface 112 to the second surface 114 of the first substrate 110. A first end portion of the through electrode 160 may contact the upper wiring of the first wiring layer. However, it is not limited thereto, and for example, the through electrode 160 may extend through the first wiring layer and may directly contact the redistribution pad 125.

A first backside insulation layer 170 may be provided on the second surface 114 of the first substrate 110, that is, a backside surface. The first bonding pads 180 may be provided on the first backside insulation layer 170. The first bonding pad 180 may be electrically connected to the through electrode 160. Accordingly, the redistribution pad 125 and the first bonding pad 180 may be electrically connected to each other by the through electrode 160.

Figure 12:
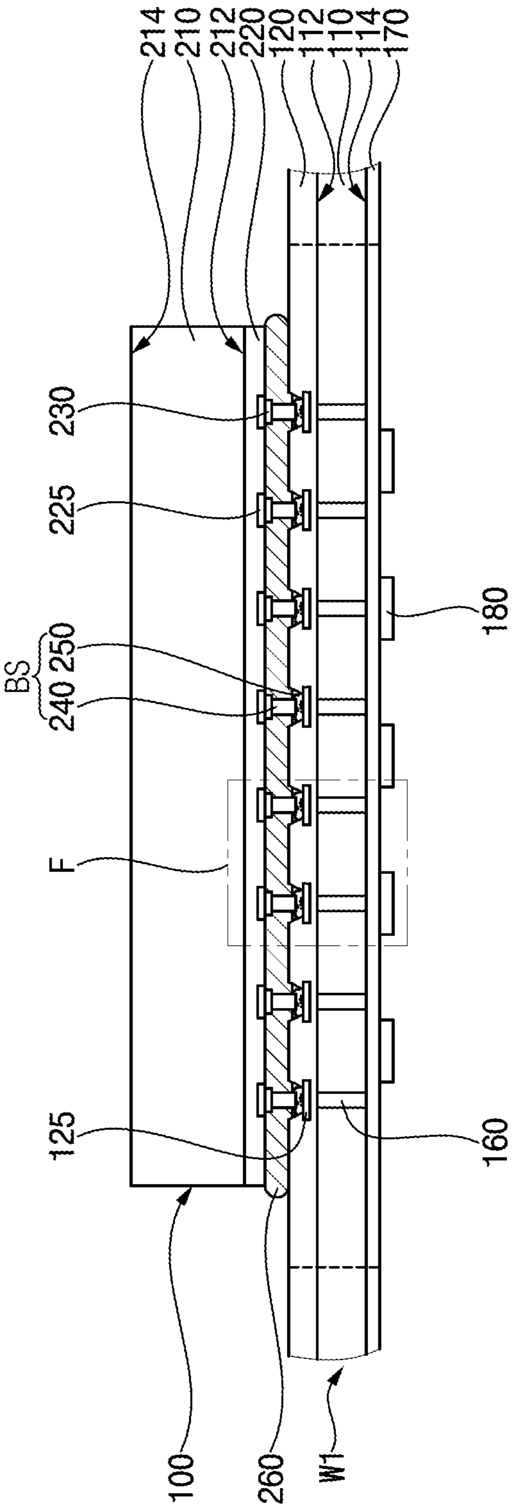
Figure 13:
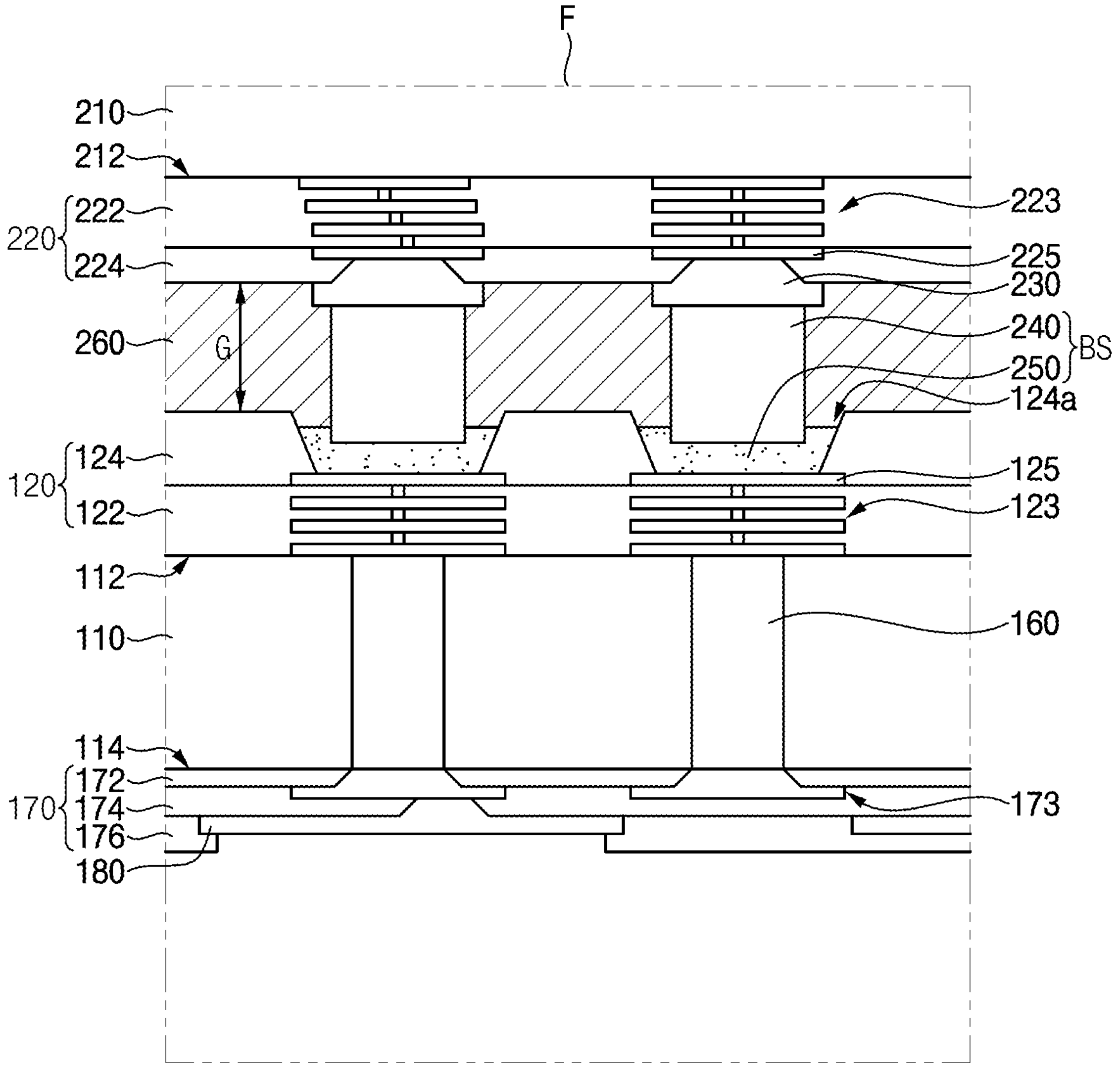

Referring to FIGS. 12 and 13, the second semiconductor chip 200 may be stacked on the first wafer W1. The second semiconductor chip 200 may be mounted on the first wafer W1 via the bump structures BS.

In some implementations, the second semiconductor chip 200 may be stacked on the first wafer W1 using a substrate support system WSS. The second semiconductor chips 200 may be disposed on the first wafer W1 to correspond to the die regions DA, respectively. Here, the bump structures BS on the second bonding pads 230 of the second semiconductor chip 200 may be disposed on the redistribution pads 125 exposed by the recesses 124*a* of the first wiring layer 120 of the first wafer W1. One end portion of the bump structure BS may be disposed within the recess 124*a* of the protective layer 124.

The second semiconductor chip 200 may be attached on the first wafer W1 using the adhesive layer 260. The second semiconductor chip 200 may be arranged such that the first surface 212 of the second substrate 210 faces the first wafer W1.

The metal paste 250 may be sintered at a predetermined temperature, e.g., about 225° C. or higher. For example, the metal paste 250 may be sintered under atmosphere of a particular gas (e.g., hydrogen) or a particular solution (e.g., formic acid) without applying pressure. Alternatively, the metal paste 250 may be sintered by a thermal compression process under a specific gas (e.g., nitrogen) atmosphere. Through this sintering process, the metal pillar 240 may be bonded to the redistribution pad 125.

Since the metal pillar 240, e.g., a copper pillar, is bonded to the redistribution pad 125 by the metal paste 250, e.g., copper paste, the formation of an intermetallic compound (IMC) between the redistribution pad 125 containing copper and the solder layer may be prevented or suppressed. Additionally, since the end portion of the bump structure BS is disposed within the recess 124*a* of the protective layer 124, a joint gap G between the first wafer W1 and the second semiconductor chip 200 may be reduced. For example, the joint gap G may be in a range of 2 μm to 20 μm.

In the thermal compression process, the non-conductive film may be liquefied and be fluid, and may flow between the second semiconductor chip 200 and the first wafer W1. The non-conductive film having fluidity may flow between the bump structures BS and then be cured to fill a space between the bump structures BS. A portion of the cured adhesive layer 260 may protrude from a side surface of the second semiconductor chip 200.

The bump structure BS of the second semiconductor chip 200 may be bonded to the redistribution pad 125 of the first semiconductor chip through the thermal compression process. The first bonding pad 180 may be electrically connected to the bump structure BS by the through electrode 160, the upper wirings 123 of the first wiring layer 120, and the redistribution pad 125.

Figure 14:
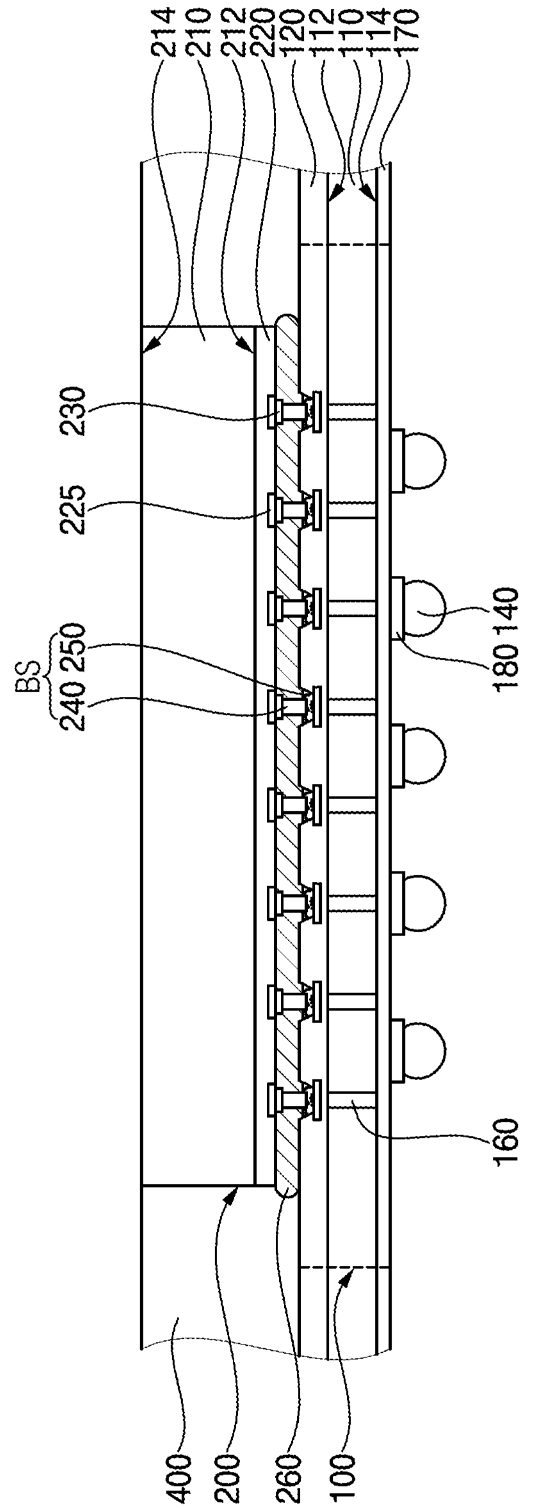

Referring to FIG. 14, a sealing member 400 may be formed on the first wafer W1 to cover the second semiconductor chip 200.

In some implementations, the sealing member 400 may be formed to fill spaces between the second semiconductor chips 200 on the first wafer W1. The sealing member 400 may be formed to surround the second semiconductor chips 200. An upper surface, that is, a backside surface of the second semiconductor chip 200 may be exposed by the sealing member 400. The sealing member 400 may be formed by a dispensing process or a spin coating process. For example, the sealing member 400 may include a thermosetting resin or the like.

Figure 15:
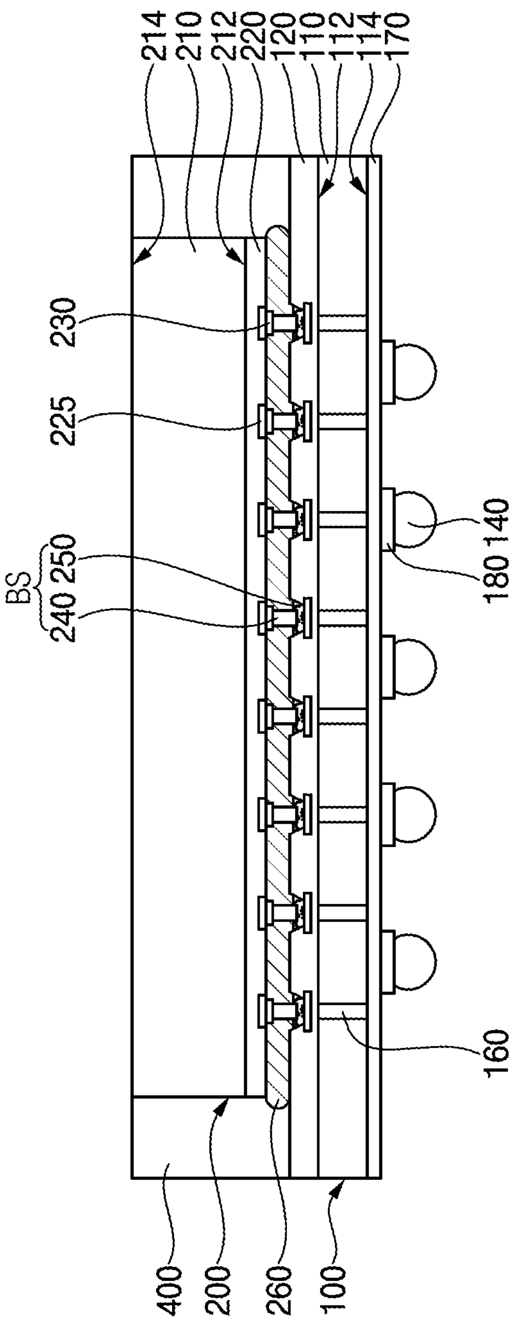

Referring to FIG. 15, conductive bumps 140 may be formed on the first bonding pads 180 of the first wafer W1, and the first wafer W1 and the sealing member 400 may be cut along the scribe lane region SA to form an individualized first semiconductor chip 100. The first wafer W1 may be cut by a sawing process. Thus, a stack package in which the second semiconductor chip 200 is stacked on the first semiconductor chip 100 may be formed.

For example, a seed layer may be formed on the first bonding pads 180 on the first backside insulating layer 170, a photoresist pattern having openings that expose portions of the seed layer may be formed, the openings of the photoresist pattern may be filled up with a conductive material, the photoresist pattern may be removed and a reflow process may be performed to form the conductive bumps. Alternatively, the conductive bumps may be formed by a screen printing method, a deposition method, and the like. The conductive bumps may include solder bumps.

Figure 16:
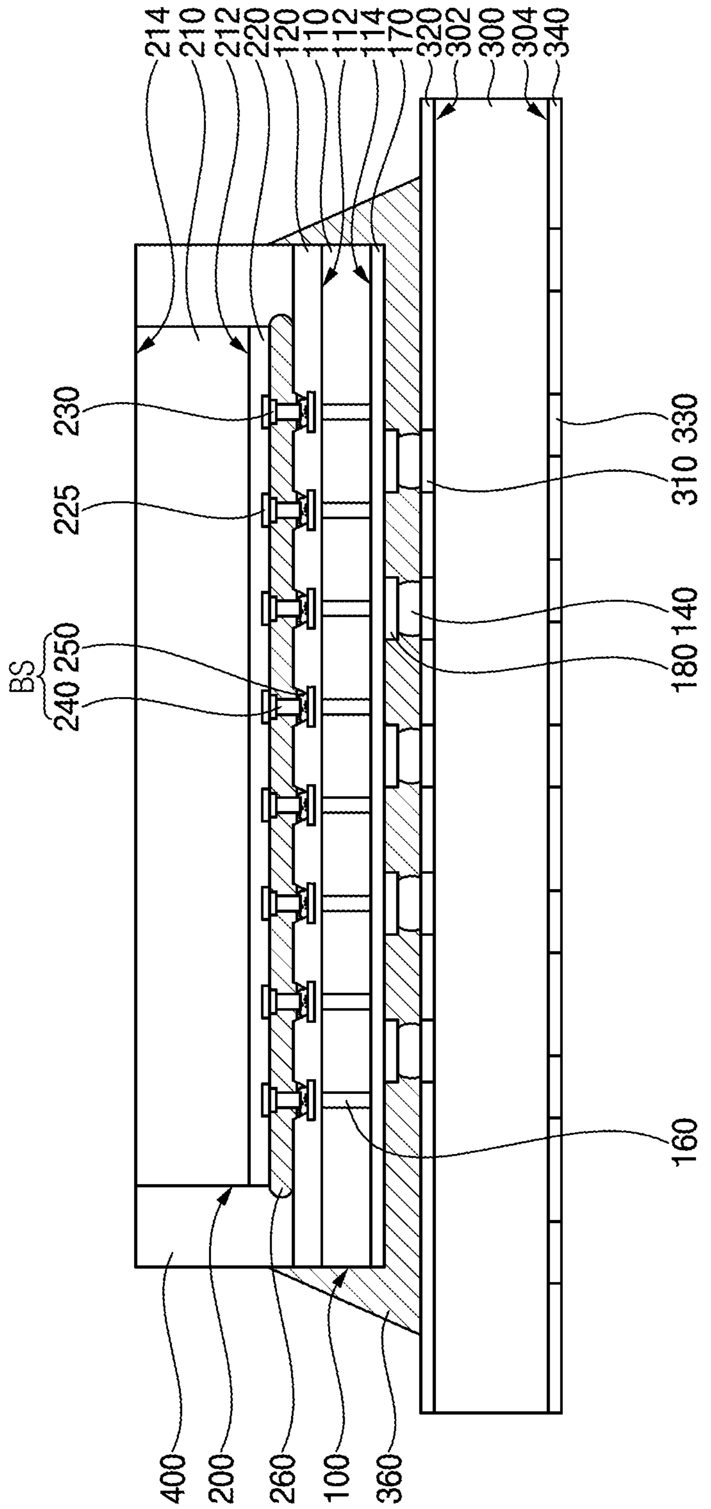

Referring to FIG. 16, the stack package may be mounted on a package substrate 300.

In some implementations, the first semiconductor chip 100 may be mounted on the package substrate 300 via the conductive bumps 140. The first surface 112 of the first substrate 110 of the first semiconductor chip 100 may face the package substrate 300. The conductive bump 140 of the first semiconductor chip 100 may be bonded to a substrate pad 310 on an upper surface 302 of the package substrate 300.

Then, an underfill member 360 may be underfilled between the first semiconductor chip 100 and the package substrate 300. While moving a dispenser nozzle along a side of the first semiconductor chip 100, an underfill solution may be dispensed between the first semiconductor chip 100 and the package substrate 300, and the underfill solution may be cured to form the underfill member 360.

For example, the underfill member may include an epoxy material to reinforce a gap between the first semiconductor chip 100 and the package substrate 300.

Then, outer connection members 350 (see FIG. 1) may be formed on outer connection pads 330 on a lower surface 304 of the package substrate 300 to complete a semiconductor package 10 (see FIG. 1).

Hereinafter, a method of manufacturing the semiconductor package of FIG. 1 according to another example will be described.

Figure 17:
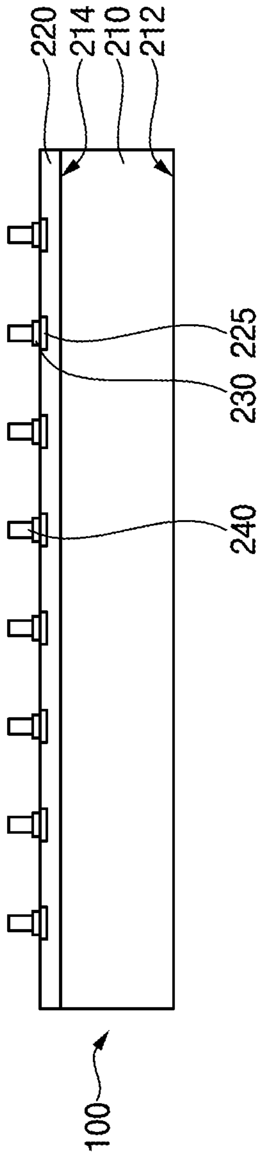
FIGS. 17 to 22 are views illustrating an example of a method of manufacturing a semiconductor package.
Figure 18:
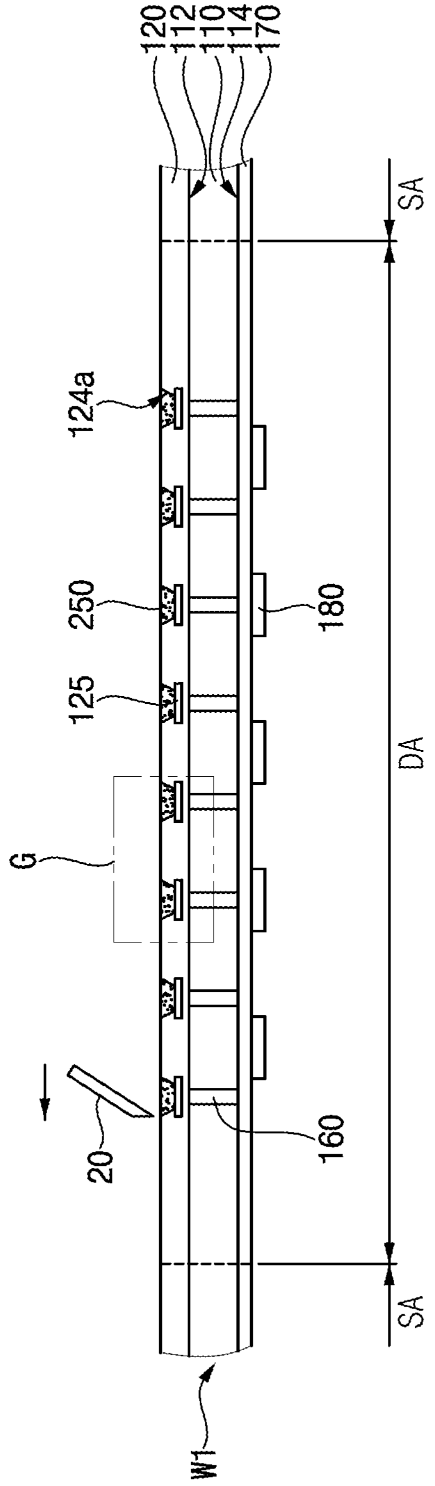
Figure 19:
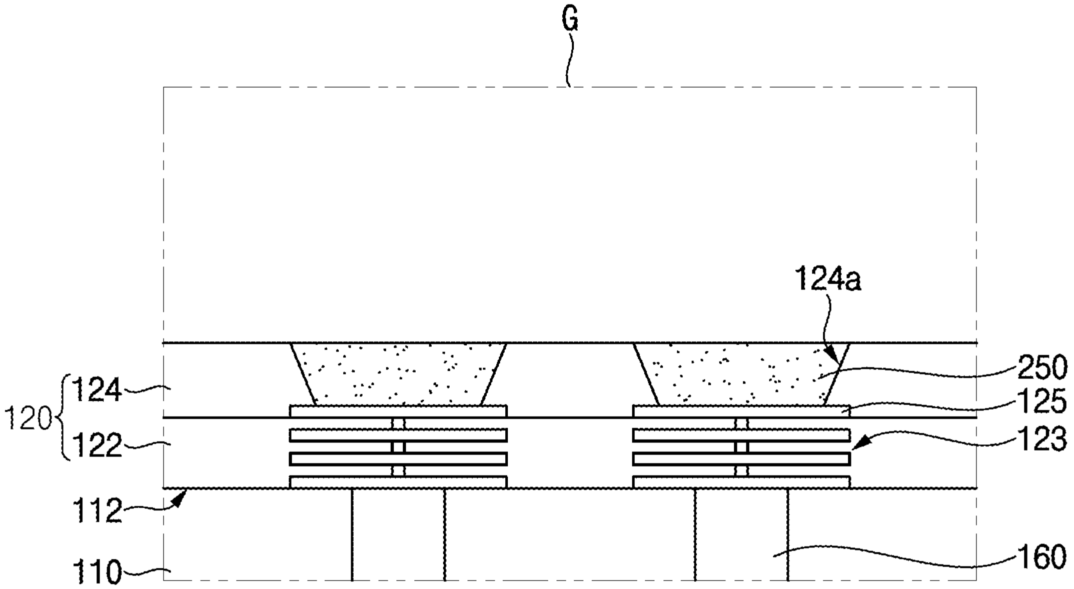
Figure 20:
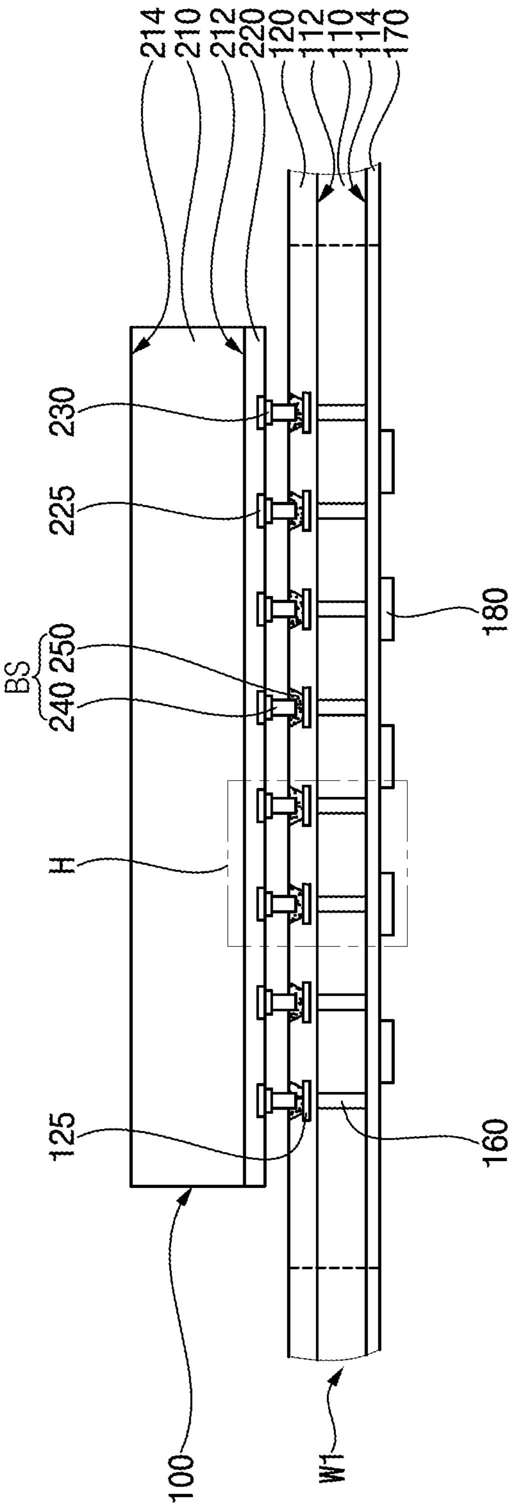
Figure 21:
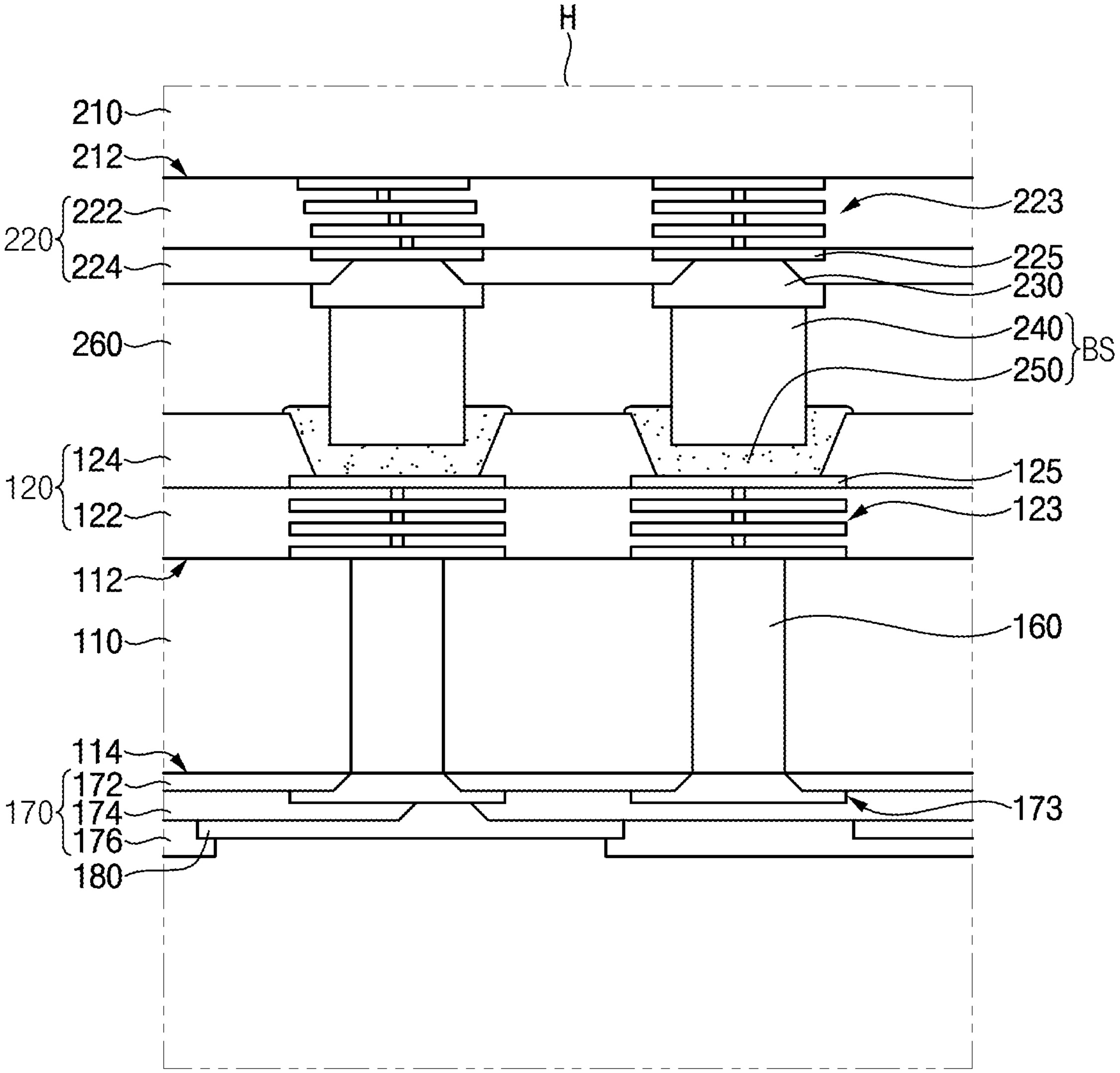

FIGS. 17 to 22 are views illustrating an example of a method of manufacturing a semiconductor package. FIG. 19 is an enlarged cross-sectional view illustrating portion 'G' in FIG. 28. FIG. 21 is an enlarged cross-sectional view illustrating portion 'H' in FIG. 20.

Referring to FIG. 17, processes the same as or similar to the processes described with reference to FIGS. 5 and 6 may be performed to form metal pillars 240 on second bonding pads 230 of a second wafer W2, and processes the same as or similar to the processes described with reference to FIG. 9 may be performed to cut the wafer W2 along a scribe lane region SA to form an individualized second semiconductor chip 200.

Referring to FIGS. 18 and 19, a metal paste 250 may be applied on the first wafer W1 of FIG. 10.

In some implementations, the metal paste 250 may be coated on the redistribution pads 125 of the first wiring layer 120 by a screen printing process. The metal paste 250, e.g., a slurry-type metal paste, may be applied on the protective layer 124 and the recesses 124*a* of the protective layer 124 may be filled up with the metal paste 250 using a squeezer 20. Here, the protective layer 124 having the recesses 124*a* formed therein may function as a stencil mask.

Referring to FIGS. 20 and 21, the second semiconductor chip 200 may be stacked on the first wafer W1.

In some implementations, the second semiconductor chip 200 may be stacked on the first wafer W1 using a substrate support system (WSS) (Chip-On-Wafer (COW) Bonding method). The second semiconductor chips 200 may be disposed on the first wafer W1 to correspond to the die regions DA, respectively. Here, one end portion of each of the metal pillars 240 on the second bonding pads 230 of the second semiconductor chip 200 may be dipped into the metal paste 250 in the recess 124*a* of the first wiring layer 120 of the first wafer W1.

The metal paste 250 may be sintered at a predetermined temperature (e.g., about 225° C. or higher). Through this sintering process, the metal pillar 240 may be bonded to the redistribution pad 125.

Since the metal pillar 240, e.g., a copper pillar, is bonded to the redistribution pad 125 by the metal paste 250, e.g., copper paste, the formation of an intermetallic compound (IMC) between the redistribution pad 125 containing copper and the solder layer may be prevented or suppressed. Additionally, since the end portion of the bump structure BS is disposed within the recess 124*a* of the protective layer 124, a joint gap G between the first wafer W1 and the second semiconductor chip 200 may be reduced.

Figure 22:
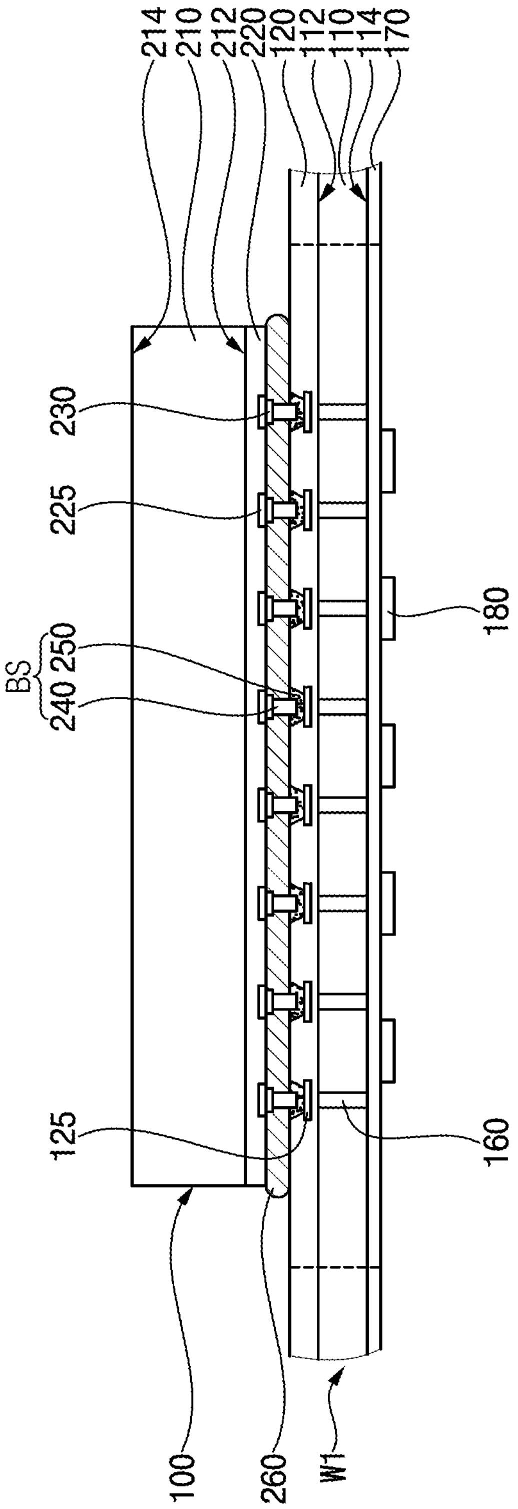

Referring to FIG. 22, an adhesive layer 260 may be underfilled between the first wafer W1 and the second semiconductor chip 200. While moving a dispenser nozzle along a side of the second semiconductor chip 200, an underfill solution may be dispensed between the second semiconductor chip 200 and the first wafer W1, and the underfill solution may be cured to form the adhesive layer 260. For example, the adhesive layer may include an epoxy material to reinforce the gap between the second semiconductor chip 200 and the first wafer W1.

Then, processes the same as or similar to the processes described with reference to FIGS. 14 to 16 may be performed to form a stack package in which the second semiconductor chip 200 is stacked on the first semiconductor chip 100, and the stack package may be mounted on the package substrate 300. Then, outer connection members 350 (see FIG. 1) may be formed on outer connection pads 330 on a lower surface 304 of the package substrate 300 to complete a semiconductor package 10 (see FIG. 1).

Figure 23:
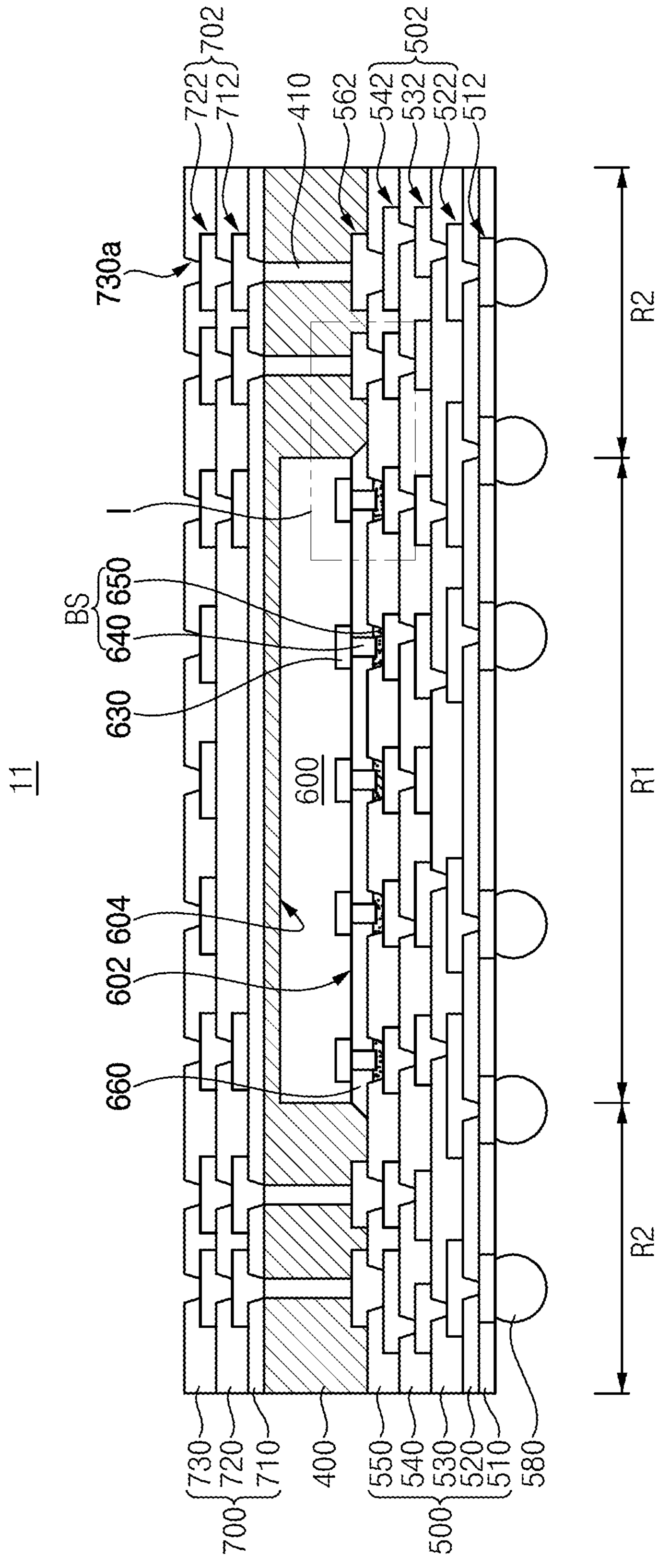
FIG. 23 is a cross-sectional view illustrating an example of a semiconductor package.
Figure 24:
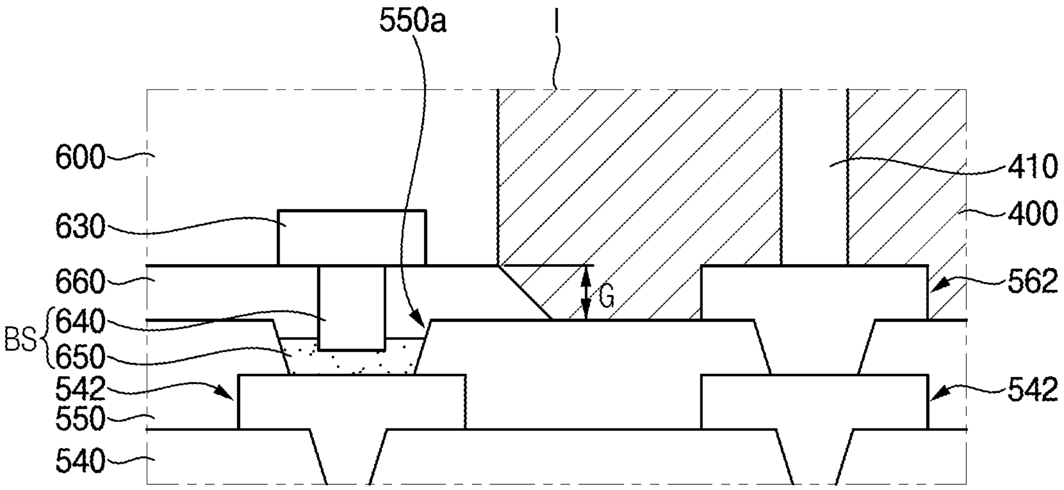
FIG. 24 is an enlarged cross-sectional view illustrating portion 'I' in FIG. 23.

FIG. 23 is a cross-sectional view illustrating a semiconductor package. FIG. 24 is an enlarged cross-sectional view illustrating portion 'I' in FIG. 23. The semiconductor package is substantially the same as the semiconductor package described with reference to FIG. 1 except for a configuration of a stack package. Thus, same reference numerals will be used to refer to the same or like elements and any further repetitive explanation concerning the above elements will be omitted.

Referring to FIGS. 23 and 24, a semiconductor package 11 includes a lower redistribution wiring layer 500, a semiconductor chip 600 disposed on the lower redistribution wiring layer 500, a sealing member 400 covering at least a portion of the semiconductor chip 600 on an upper surface of the lower redistribution wiring layer 500, and an upper redistribution wiring layer 700 disposed on the upper surface of the sealing member 400. Additionally, the semiconductor package 11 may further include outer connection members 580 disposed on an outer surface of the lower redistribution wiring layer 500.

In some implementations, the semiconductor package 11 may be a fan-out package in which the lower redistribution wiring layer 500 extends to the sealing member 400 that covers a side surface of the semiconductor chip 600. The lower redistribution wiring layer 500 may be formed by a wafer level redistribution wiring process. Additionally, the semiconductor package 11 may be provided as a unit package on which a second package is stacked.

Further, the semiconductor package 11 may be provided as a System In Package (SIP). For example, one or more semiconductor chips may be disposed on the lower redistribution wiring layer 500. The semiconductor chips may include a logic chip and/or a memory chip including a logic circuit. The logic chip may be a controller that controls memory chips. The memory chip may include various types of memory circuits, such as DRAM, SRAM, flash, PRAM, ReRAM, FeRAM, or MRAM.

In some implementations, the lower redistribution wiring layer 500 may have first redistribution wirings 502. The semiconductor chip 600 may be disposed on the lower redistribution wiring layer 500 to be electrically connected to the first redistribution wirings 502. The lower redistribution wiring layer 500 may be provided on a front surface 602 of the semiconductor chip 600 and may function as a front redistribution wiring layer. Accordingly, the lower redistribution wiring layer 500 may be a front redistribution wiring layer (FRDL) of the fan-out package.

In particular, the lower redistribution wiring layer 500 includes a plurality of first to fifth lower insulating layers 510, 520, 530, 540 and 550 and first redistribution wirings 502 provided in the first to fifth lower insulating layers. The first redistribution wirings 502 may include first to third lower redistribution wirings 522, 532 and 542. The first redistribution wirings 502 may include the first to third lower redistribution wirings 522, 532 and 542 stacked in three layers. In this case, the third lower redistribution wiring 542 may correspond to an uppermost redistribution wiring among the first redistribution wirings.

The first to fifth lower insulating layers may include a polymer, a dielectric layer, and the like. For example, the first to fifth lower insulating layers may include a photosensitive insulating layer such as photo imageable dielectric (PID). The first to fifth lower insulating layers may be formed by a vapor deposition process, spin coating process, and the like. The first redistribution wirings may include aluminum (Al), copper (Cu), tin (Sn), nickel (Ni), gold (Au), platinum (Pt), or alloys thereof. The first redistribution wirings may be formed by a plating process, an electroless plating process, a vapor deposition process, and the like.

The numbers and arrangements of the lower insulating layers and the lower redistribution wirings of the lower redistribution wiring layer are provided as examples, and it will be understood that the present disclosure is not limited thereto.

In some implementations, the semiconductor chip 600 may have a plurality of chip pads 630 on the front surface 602, that is, an active surface. The semiconductor chip 600 may be mounted on the lower redistribution wiring layer 500 such that the first surface on which the chip pads 630 are formed faces the lower redistribution wiring layer 500.

The semiconductor chip 600 may be mounted on the lower redistribution wiring layer 500 by a flip chip bonding method. The semiconductor chip 600 may be mounted on the lower redistribution wiring layer 500 via bump structures BS. The bump structure BS may be disposed between the third lower redistribution wiring 542, which is the uppermost redistribution wiring of the lower redistribution wiring layer 500 and the chip pad 630 of the semiconductor chip 600, to electrically connect the semiconductor chip 600 and the first redistribution wirings 502.

In some implementations, each of the bump structures BS may include a metal pillar 640 provided on the chip pad 630 and a metal paste 650 coated on one end portion of the metal pillar 640.

The metal pillar 640 may include, for example, copper (Cu), copper alloy, nickel (Ni), nickel alloy, palladium (Pd), platinum (Pt), gold (Au), cobalt (Co), and a combination thereof. In this example, the metal pillar 640 may include copper (Cu). The metal pillar 640 may have a diameter within a range of 5 μm to 50 μm. The metal pillar 640 may be formed on the chip pad 630 through a plating process.

The metal paste 650 may be provided to cover the end portion of the metal pillar 640. The metal paste 650 may be a copper paste containing copper. The metal paste 650 may include a copper powder and a paste flux. The metal paste 650 may be bonded to the uppermost redistribution wiring 542 of the lower redistribution wiring layer 500 by a sintering process. Accordingly, the metal pillar 640 may be bonded to the uppermost redistribution wiring 542 using the metal paste 650.

The fifth lower insulating layer 550 as a protective layer may include a recess **550*a* that exposes at least a portion of the uppermost redistribution wiring 542. The recess 550*a* may have a diameter greater than the diameter of the metal pillar 640. The diameter of the recess 550*a* may be within a range of 8 μm to 60 μm. The recess 550*a* may have a depth within a range of 3 μm to 10 μm from an upper surface of the fifth lower insulating layer 550. The recess 550*a* may have an inner wall inclined at a predetermined angle with respect to the upper surface of the fifth lower insulating layer 550**.

The recess **550*a* may accommodate one end portion of the bump structure BS that is formed on the chip pad 630 of the semiconductor chip 600. At least a portion of the metal paste 650 covering the end portion of the metal pillar 640 may be accommodated in the recess 550*a***.

Since the metal pillar 640, e.g., a copper pillar, is bonded to the uppermost redistribution wiring 542 by the metal paste 650, e.g., copper paste, the formation of an intermetallic compound (IMC) between the uppermost redistribution wiring 542 containing copper and the solder layer may be prevented or suppressed. Additionally, since the end portion of the bump structure BS is disposed within the recess **550*a* of the fifth lower insulating layer 550, a joint gap G between the lower redistribution wiring layer 500 and the semiconductor chip 600** may be reduced.

Accordingly, the chip pad 630 of the semiconductor chip 600 may be electrically connected to the uppermost redistribution wiring 542 of the lower redistribution wiring layer 500 by the bump structure BS. An underfill member 660 may be disposed between the semiconductor chip 600 and the lower redistribution wiring layer 500.

Although only a few chip pads are illustrated in the figures, the structures and arrangements of the chip pads are provided as examples, and it will be understood that the present inventive concept is not limited thereto. Additionally, although only one semiconductor chip is illustrated, it may not be limited thereto, and a plurality of semiconductor chips may be stacked on the lower redistribution wiring layer.

In some implementations, the sealing member 400 may cover at least a portion of the semiconductor chip 600 on the upper surface of the lower redistribution wiring layer 500. The sealing member 400 may include a first sealing portion that covers an upper surface 604 of the semiconductor chip 600 and a second sealing portion that covers the upper surface of the lower redistribution wiring layer 500 around the semiconductor chip 600.

For example, the sealing member 400 may include an epoxy mold compound (EMC). The sealing member 400 may be formed by a molding process, screen printing process, lamination process, and the like.

In some implementations, a plurality of through vias 410 may extend in a vertical direction to penetrate the sealing member 400. The through via 410 may be formed on the second bonding pad 562 on the third lower redistribution wiring 542. The second bonding pads 562 may be provided on the third lower redistribution wirings 542 exposed by the recesses 550*a* in the second region R2.

The through via 410 may be provided to penetrate the sealing member 400 and may serve as an electrical connector. The through via 410 may be a through mold via (TMV) formed through the second sealing portion of the sealing member 400. That is, the through vias 410 may be provided in the fan-out region outside the area where the semiconductor chip 600 is disposed, and may electrically connect the lower redistribution wiring layer 500 and the upper redistribution wiring layer 700.

In some implementations, the upper redistribution wiring layer 700 may be disposed on the sealing member 400 and may include second redistribution wirings 702 electrically connected to the through vias 410. The second redistribution wirings 702 may include upper redistribution wirings stacked in at least two layers on the upper surface of the sealing member 400. The second redistribution wirings 702 may be provided on the sealing member 400 to serve as backside redistribution wirings. Accordingly, the upper redistribution wiring layer 700 may be a backside redistribution wiring layer (BRDL) of the fan-out package.

The second redistribution wirings 702 may include a first upper redistribution wiring 712 and a second upper redistribution wiring 722 stacked in two layers. In this case, the second upper redistribution wiring 722 may correspond to an uppermost redistribution wiring among the second redistribution wirings.

A first upper insulating layer 710 may be provided on the upper surface of the sealing member 400 and may have openings that expose the upper surfaces of the through vias 410. The first upper redistribution wirings 712 may be formed on the first upper insulating layer 710 and at least portions of the first upper redistribution wirings 712 may directly contact the through vias 410 through the openings.

A second upper insulating layer 720 may be provided on the first upper insulating layer 710 and may have openings that expose the first upper redistribution wirings 712. The second upper redistribution wirings 722 may be formed on the first upper insulating layer 710 and at least portions of the second upper redistribution wirings 722 may directly contact the first upper redistribution wirings 712 through the openings.

A third upper insulating layer 730 may be provided on the second upper insulating layer 720 and may have recesses 730*a* that expose at least portions of the second upper redistribution wirings 722. The third upper insulating layer 730 may function as a passivation layer. In some implementations, upper bonding pads may be provided on the second upper redistribution wirings 722, respectively.

For example, the first to third upper insulating layers may include polymer, a dielectric layer, and the like. The first to third upper insulating layers may include a photosensitive insulating material (PID) or an insulating film such as Ajinomoto Build-up Film (ABF). The second redistribution wirings may include copper (Cu), aluminum (Al), tin (Sn), nickel (Ni), gold (Au), platinum (Pt), or alloys thereof.

The numbers and arrangements of the upper insulating layers and the upper redistribution wirings of the upper redistribution wiring layer are provided as examples, and it will be understood that the present inventive concept is not limited thereto.

In some implementations, the outer connection members 580 may be disposed on first bonding pads 512 on the outer surface of the lower redistribution wiring layer 500. For example, the outer connection member 580 may include a solder ball. The semiconductor package 11 may be mounted on a module substrate using the solder balls to form a memory module.

Hereinafter, a method of manufacturing the semiconductor package of FIG. 23 will be described.

Figure 25:
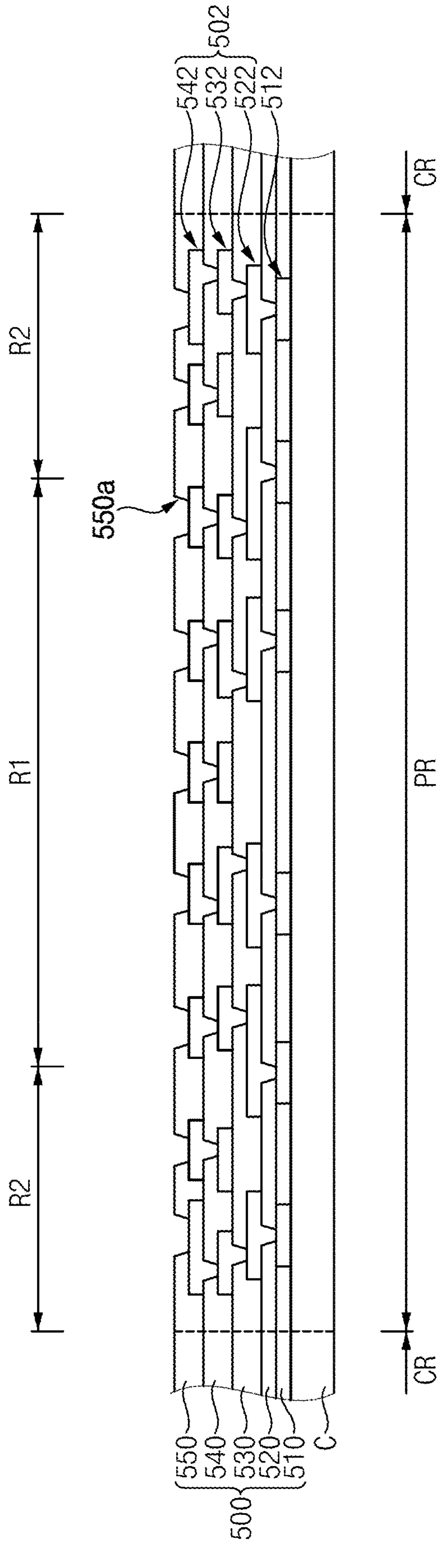
FIGS. 25 to 32 are views illustrating an example of a method of manufacturing a semiconductor package.
Figure 26:
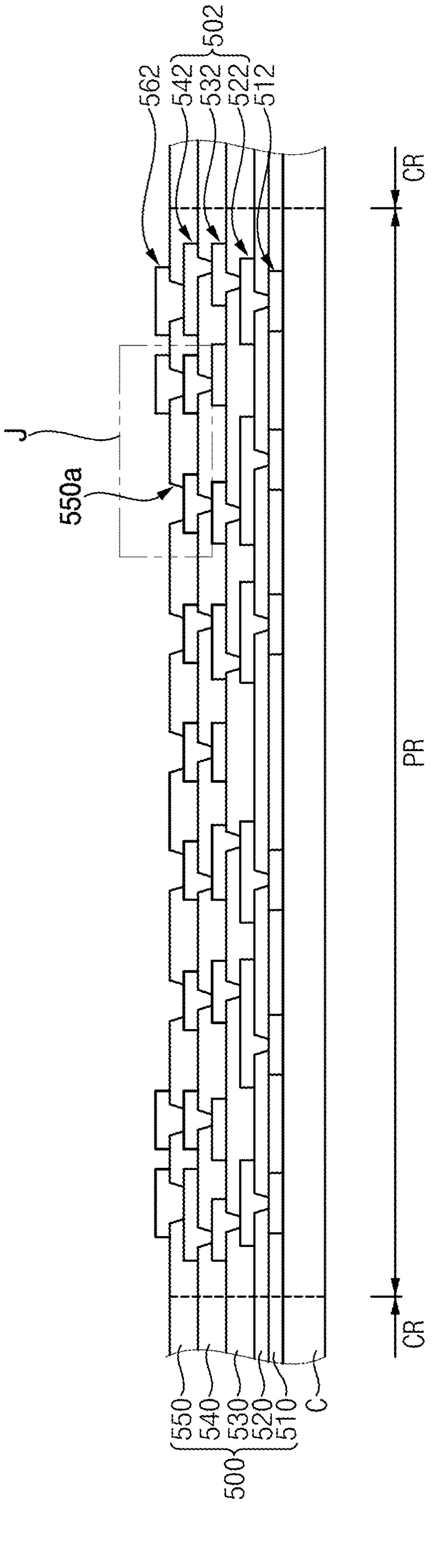
Figure 27:
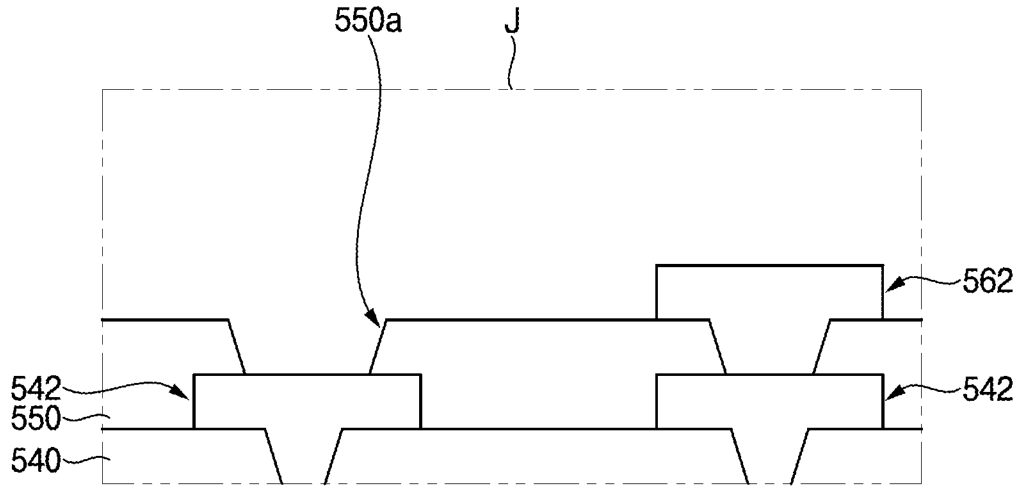
Figure 28:
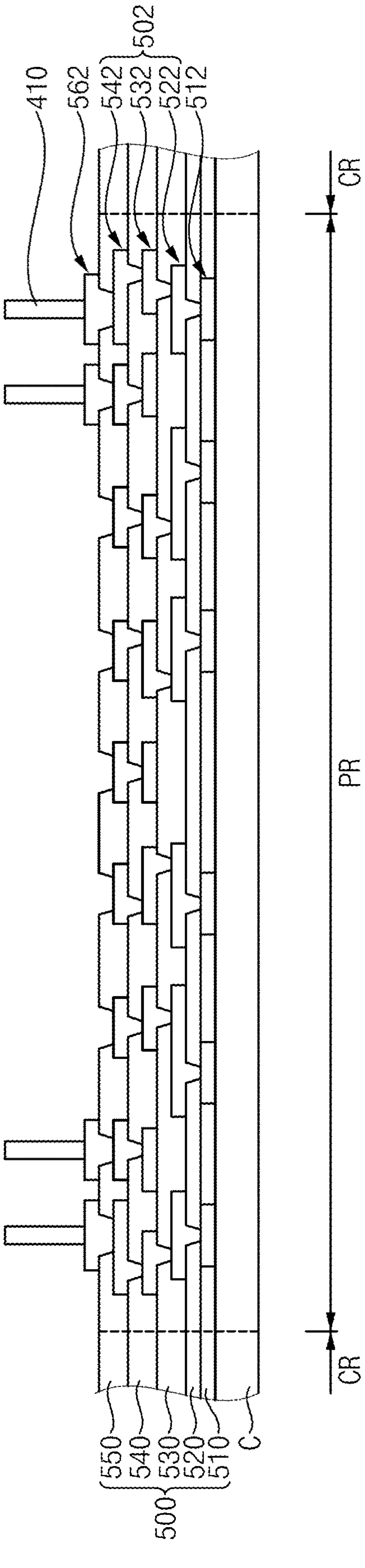
Figure 29:
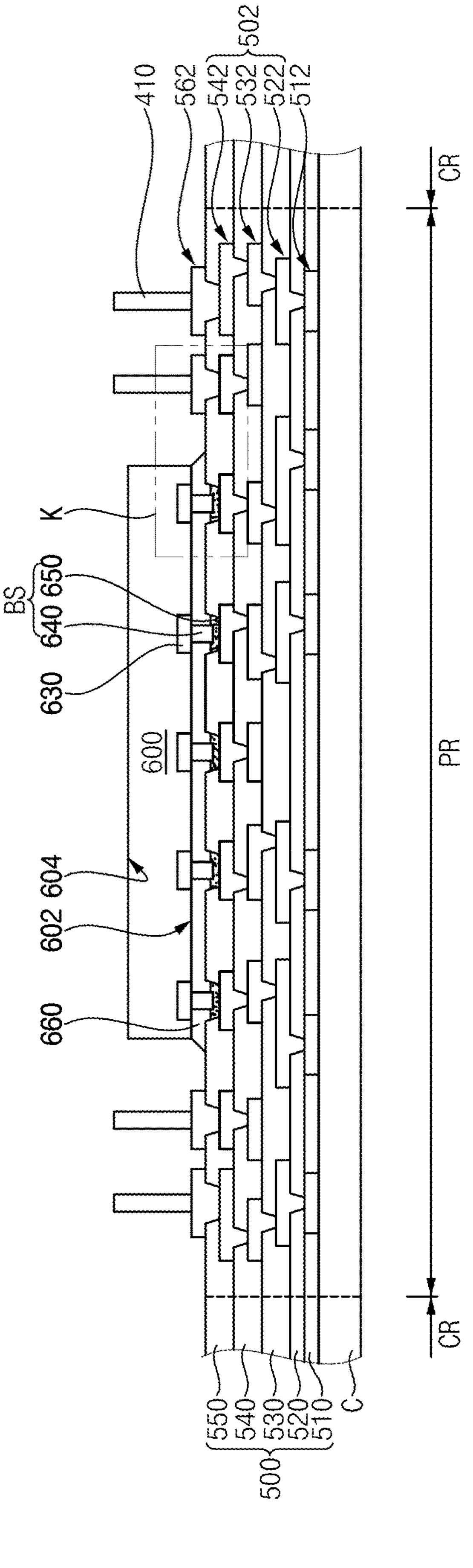
Figure 30:
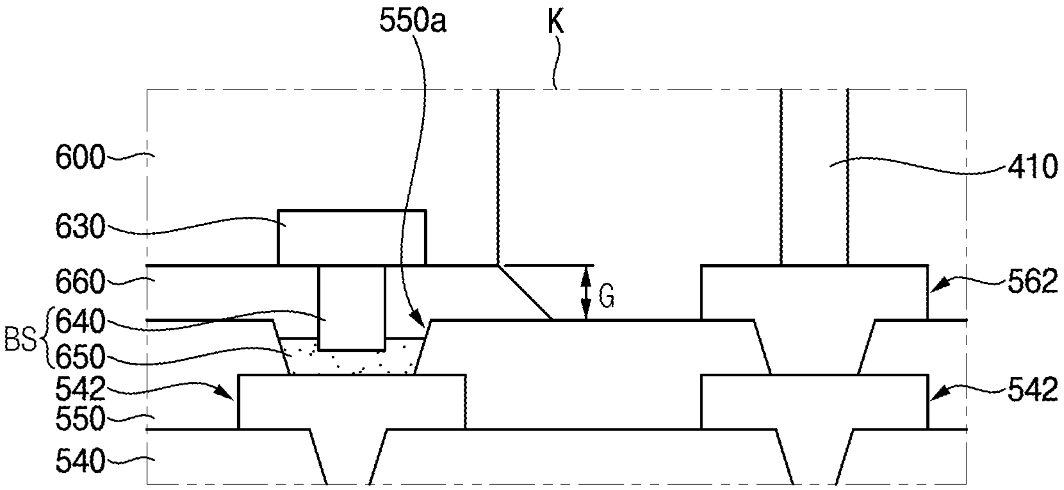

FIGS. 25 to 32 are views illustrating a method of manufacturing a semiconductor package. FIG. 27 is an enlarged cross-sectional view illustrating portion 'J' in FIG. 26. FIG. 30 is an enlarged cross-sectional view illustrating portion 'K' in FIG. 29.

Referring to FIG. 25, a lower redistribution wiring layer 500 having first redistribution wirings 502 may be formed on a carrier substrate C.

In some implementations, the carrier substrate C may include a wafer substrate as a base substrate on which a plurality of semiconductor chips is disposed on the lower redistribution wiring layer and a sealing member is formed to cover them. The carrier substrate C may have a shape corresponding to a wafer on which a semiconductor process is performed. For example, the carrier substrate C may include a silicon substrate, a glass substrate, a non-metal or metal plate, and the like.

The carrier substrate C may include a package region PR on which the semiconductor chip is mounted and a cutting region CR surrounding the package region PR. As will be described later, the lower redistribution wiring layer 500 and the sealing member formed on the carrier substrate C may be cut along the cutting region CR that divides the plurality of package regions MR to be individualized.

Additionally, the package region PR of the carrier substrate C may include a first region R1 overlapping the semiconductor chip and a second region R2 surrounding the first region R1. The second region R2 may be a fan-out region outside the region where the semiconductor chip is disposed.

As illustrating in FIG. 25, a plating process may be performed on the carrier substrate C to form a first lower insulating layer 510 having first bonding pads 512 formed therein. In some implementations, after a release film, a barrier metal layer, a seed layer and the first lower insulating layer are sequentially formed on the carrier substrate C, the first lower insulating layer may be patterned to form openings that expose first bonding pad regions. Then, the plating process may be performed on the seed layer to form the first bonding pads 512 in the openings.

For example, the first lower insulating layer 510 may include a polymer, a dielectric layer, and the like. The first lower insulating layer 510 may include a photosensitive insulating material (PID) or an insulating film such as ABF. The first lower insulating layer may be formed by a spin coating process, a vapor deposition process, and the like. The first bonding pad may include copper (Cu), aluminum (Al), tin (Sn), nickel (Ni), gold (Au), platinum (Pt), or an alloy thereof.

Then, a second lower insulating layer 520 may be formed on the first lower insulating layer 510 to cover the first bonding pads 512, and then the second lower insulating layer 520 may be patterned to form first openings that expose at least portions of the first bonding pads 512.

For example, the second lower insulating layer 520 may include a polymer, a dielectric layer, and the like. The second lower insulating layer 520 may include a photosensitive insulating material (PID) or an insulating film such as ABF. The second lower insulating layer may be formed by a spin coating process, a vapor deposition process, and the like.

Then, first lower redistribution wirings 522 may be formed on the second lower insulating layer 520. For example, after forming a seed layer on portions of the first bonding pads 512 and in the first opening, the seed layer may be patterned, and an electrolytic plating process may be performed to form the first lower redistribution wirings 522. Accordingly, at least portions of the first lower redistribution wirings 522 may electrically connected to the first bonding pads 512 through the first openings.

Similarly, a third lower insulating layer 530 may be formed on the second lower insulating layer 520 to cover the first lower redistribution wirings 522, and the third lower insulating layer 530 may be patterned to form second openings that expose at least portions of the first lower redistribution wirings 522. Then, second lower redistribution wirings 532 may be formed on the third lower insulating layer 530 to be electrically connected to the first lower redistribution wirings 522 through the second openings.

Then, a fourth lower insulating layer 540 may be formed on the third lower insulating layer 530 to cover the second lower redistribution wirings 536, and then the fourth lower insulating layer 540 may be patterned to form third openings that expose at least portions of the second lower redistribution wirings 532. Then, third lower redistribution wirings 542 may be formed on the fourth lower insulating layer 540 to be electrically connected to the second lower redistribution wirings 532 through the third openings.

Then, a fifth lower insulating layer 550 as a protective layer may be formed on the fourth lower insulating layer 540 to cover the third lower redistribution wirings 542, and the fifth lower insulating layer 550 may be patterned to form recesses 550*a* that expose portions of the third lower redistribution wirings 542. For example, the fifth lower insulating layer 550 may include solder resist.

In some implementations, an upper surface of the third lower redistribution wiring 542, which is an uppermost redistribution wiring, may be exposed through a bottom face of the recess 550*a*. As will be described below, the recess 550*a* may accommodate one end portion of a bump structure that is formed on a chip pad of the semiconductor chip. A diameter of the recess 550*a* may be within a range of 8 μm to 60 μm. The recess 550*a* may have a depth within a range of 3 μm to 10 μm from an upper surface of the fifth lower insulating layer 550. The recess 550*a* may have an inner wall inclined at a predetermined angle with respect to the upper surface of the fifth lower insulating layer 550.

Referring to FIGS. 26 and 27, second bonding pads 562 may be formed on the third lower redistribution wirings 542 exposed by the recesses 550*a* in the second region R2. Bonding pads may not be formed on the uppermost redistribution wirings 542 in the first region R1. As will be described below, through vias may be formed on the second bonding pads 256 in the fan-out region.

Thus, the lower redistribution wiring layer 500 having the first to fifth lower insulating layers 510, 520, 530, 540 and 550 may be formed. The lower redistribution wiring layer 500 may include the first redistribution wirings 502 stacked in at least two layers. The first redistribution wirings 502 may include the first to third lower redistribution wirings 522, 532 and 542 stacked in three layers. In this case, the third lower redistribution wiring 542 may correspond to the uppermost redistribution wiring among the first redistribution wirings. The lower redistribution wiring layer 500 may be a front redistribution wiring layer (FRDL) of a fan-out package. The second bonding pads 562 may be exposed from an upper surface of the lower redistribution wiring layer 500.

Referring to FIG. 28, a plurality of through vias 410 as conductive structures may be formed on the upper surface of the lower redistribution wiring layer 500.

In some implementations, a photoresist layer may be formed on the upper surface of the lower redistribution wiring layer 500, and an exposure process may be performed on the photoresist layer to form a photoresist pattern having openings that are provided on the fan-out region of the lower redistribution wiring layer 500 for forming the plurality of through vias. The opening may expose at least a portion of the second bonding pad 562 in the fan-out region.

Then, an electro plating process may be performed to fill the openings of the photoresist pattern with a conductive material to form the through vias 410. Then, the photoresist pattern can be removed by a strip process.

The through via 410 as a conductive connection structure may extend upward from the second bonding pad 562. The through vias 410 may be electrically connected to the first redistribution wirings 502. As will be described below, the through via 410 may be provided to penetrate the sealing member and may serve as an electrical connector. That is, the through vias 410 may be provided in the fan-out area outside the area where the semiconductor chip (die) is placed and may be used for electrical connection.

Referring to FIGS. 29 and 30, at least one semiconductor chip 600 may be mounted on the upper surface of the lower redistribution wiring layer 500.

In some implementations, the semiconductor chip 600 may be disposed in the fan-in region R1 of the lower redistribution wiring layer 500. The semiconductor chip 600 may be mounted on the upper surface of the lower redistribution wiring layer 500 by a flip chip bonding method. The semiconductor chip 600 may be disposed such that a front surface 602 on which chip pads 630 are formed, that is, an active surface, faces the lower redistribution wiring layer 500. The chip pads 630 of the semiconductor chip 600 may be electrically connected to the first redistribution wirings 502 of the lower redistribution wiring layer 500 by bump structures BS.

Each of the bump structures BS may include a metal pillar 640 provided on the chip pad 630 of the semiconductor chip 600 and a metal paste 650 coated on one end portion of the metal pillar 640.

The metal paste 650 may be provided to cover the end portion of the metal pillar 640. The metal paste 650 may be a copper paste containing copper. The metal paste 650 may be bonded to the uppermost redistribution wiring 542 of the lower redistribution wiring layer 500 by a sintering process. Accordingly, the metal pillar 640 may be bonded to the uppermost redistribution wiring 542 using the metal paste 650. At least a portion of the metal paste 650 covering the end portion of the metal pillar 640 may be accommodated in the recess 550*a* of the fifth lower insulating layer 550 that exposes at least a portion of the uppermost redistribution wiring 542.

Since the metal pillar 640, e.g., a copper pillar, is bonded to the uppermost redistribution wiring 542 by the metal paste 650, e.g., copper paste, the formation of an intermetallic compound (IMC) between the uppermost redistribution wiring 542 containing copper and the solder layer may be prevented or suppressed. Additionally, since one end portion of the bump structure BS is disposed within the recess 550*a* of the fifth lower insulating layer 550, a joint gap G between the lower redistribution wiring layer 500 and the semiconductor chip 600 may be reduced.

An underfill member 660 may be underfilled between the semiconductor chip 600 and the lower redistribution wiring layer 500. The underfill member may include a material with relatively high fluidity to effectively fill the small space between the semiconductor chip and the lower redistribution wiring layer. For example, the underfill member may include an adhesive containing an epoxy material.

The semiconductor chip may be a logic chip including a logic circuit. The logic chip may be a controller that controls memory chips. The semiconductor chip may be a processor chip such as an ASIC or an application processor (AP) serving as a host such as CPU, GPU, or SOC.

Figure 31:
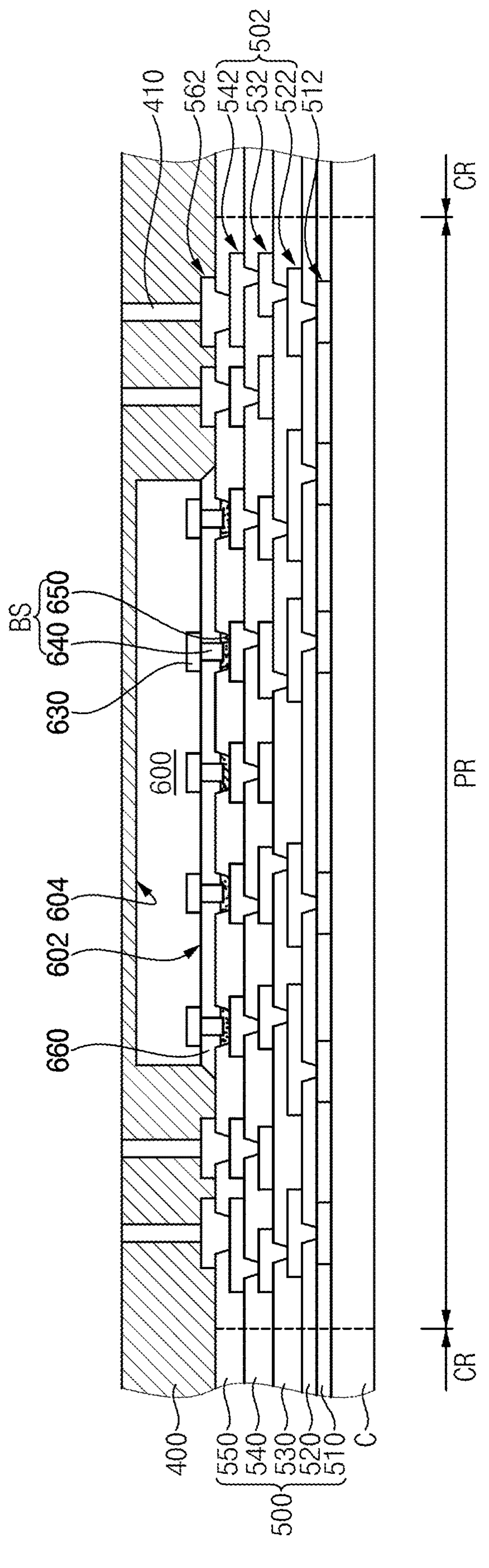

Referring to FIG. 31, a sealing member 400 may be formed on the upper surface of the lower redistribution wiring layer 500 to cover the semiconductor chip 600 and the plurality of through vias 410.

The sealing member 400 may be formed to cover an upper surface 604 of the semiconductor chip 600. The sealing member 400 may expose upper surfaces of the plurality of through vias 410. For example, the sealing member 400 may include an epoxy mold compound (EMC). The sealing member 400 may include UV resin, polyurethane resin, silicone resin, silica filler, and the like.

Accordingly, the plurality of through vias 410 may be formed on the upper surface of the fan-out region of the lower redistribution wiring layer 500 and may extend to penetrate the sealing member 400. The through via 410 may be a through mold via (TMV) formed through the sealing member 400.

Figure 32:
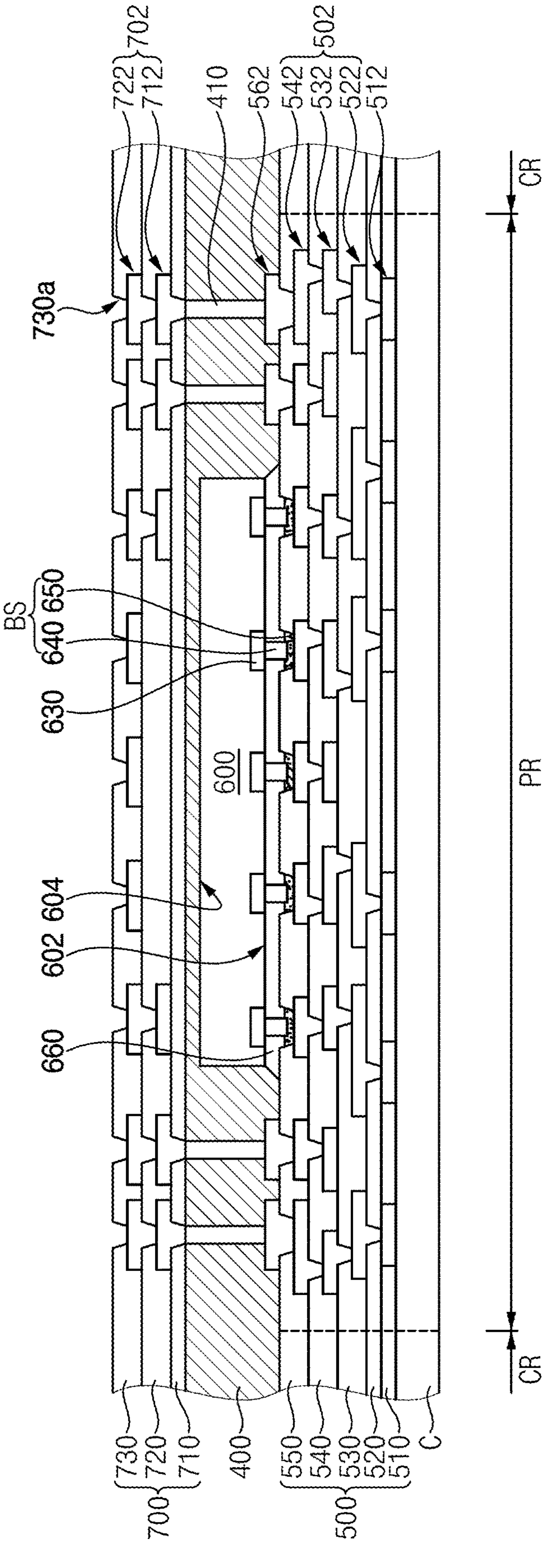

Referring to FIG. 32, an upper redistribution wiring layer 700 having second redistribution wirings 702 electrically connected to the through vias 410 may be formed on the upper surface of the sealing member 400.

In some implementations, after forming a first upper insulating layer 710 is formed on the upper surface of the sealing member 400, the first upper insulating layer 710 may be patterned to form openings that expose the through vias 410 respectively. The openings in the patterned first upper insulating layer 710 may expose upper surfaces of the through vias 410.

Then, after a seed layer is formed on portions of the exposed through vias 410 and in the openings, the seed layer may be patterned and an electro plating process may be performed to form first upper redistribution wirings 712. Accordingly, at least portions of the first upper redistribution wirings 712 may be electrically connected to the through vias 410 through the openings.

Then, after a second upper insulating layer 720 is formed on the first upper insulating layer 710, the second upper insulating layer 720 may be patterned to form openings that expose the first upper redistribution wirings 712. Then, second upper redistribution wirings 722 may be formed on the second upper insulating layer 720 to be electrically connected to the first upper redistribution wirings 712 through the openings.

Thus, the second redistribution wirings 702 may include the first and second upper redistribution wirings 712 and 722 stacked in two layers. In this case, the second upper redistribution wiring 722 may correspond to an uppermost redistribution wiring among the second redistribution wirings.

Then, a third upper insulating layer 730 may be formed on the second upper insulating layer 720 to cover the second upper redistribution wirings 722, and the third upper insulating layer 730 may be patterned to form recesses **730*a* that expose at least portions of the second upper redistribution wirings 722. The third upper insulating layer 730** may function as a passivation layer.

In some implementations, upper bonding pads may be formed on the second upper redistribution wirings 722 as the uppermost redistribution wirings.

Then, the carrier substrate C may be removed, and outer connection members (580, see FIG. 23) may be formed on an outer surface, that is, a lower surface of the lower redistribution wiring layer 500 to be electrically connected to the first redistribution wirings 502 respectively.

Then, a sawing process may be performed to individualize the lower redistribution wiring layer 500, to complete a fan out wafer level package, e.g., semiconductor package 11 of FIG. 1 including the sealing member 400, the lower redistribution wiring layer 500 formed on the lower surface of the sealing member 400 and the upper redistribution wiring layer 700 formed on the upper surface of the sealing member 400.

Figure 33:
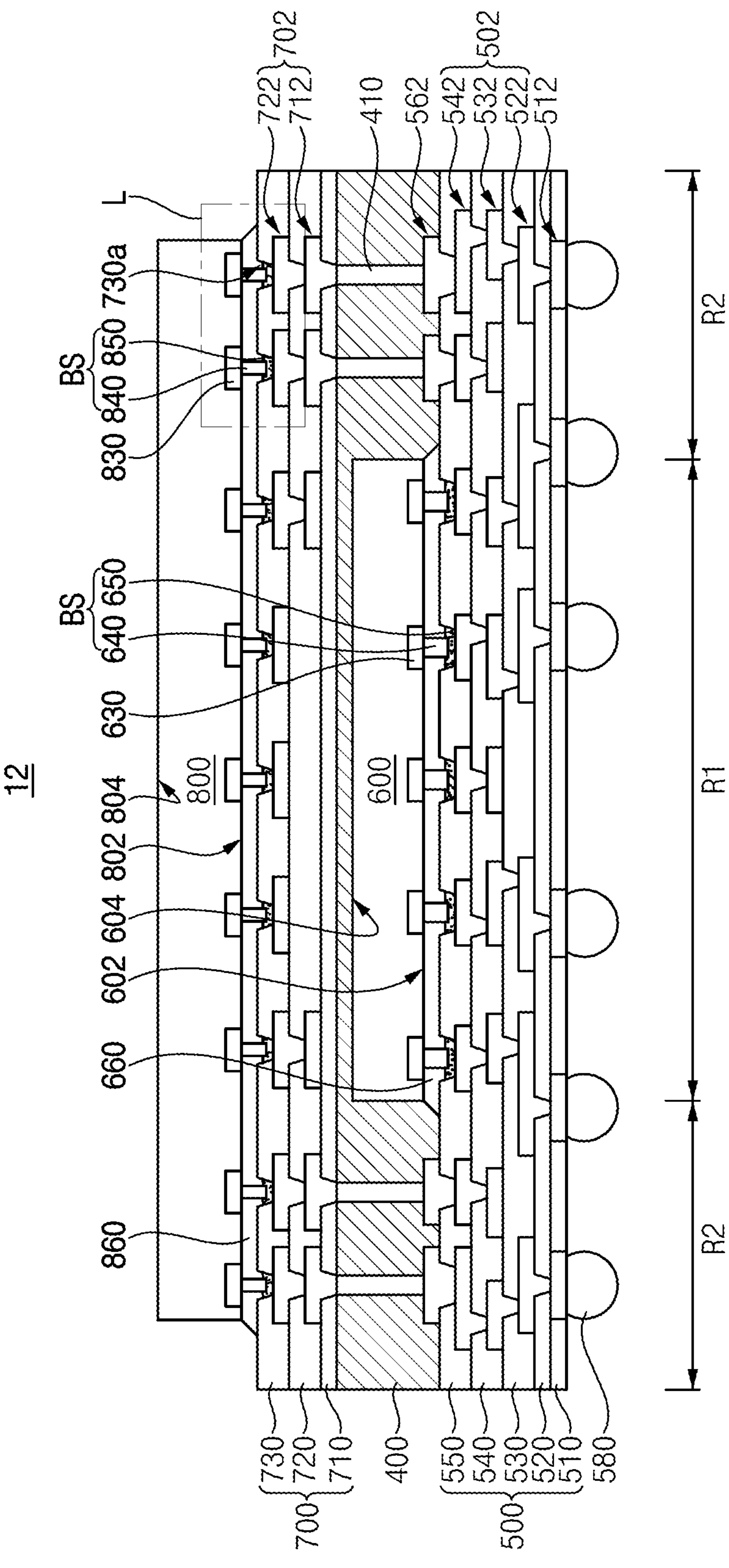
FIG. 33 is a cross-sectional view illustrating an example of a semiconductor package.
Figure 34:
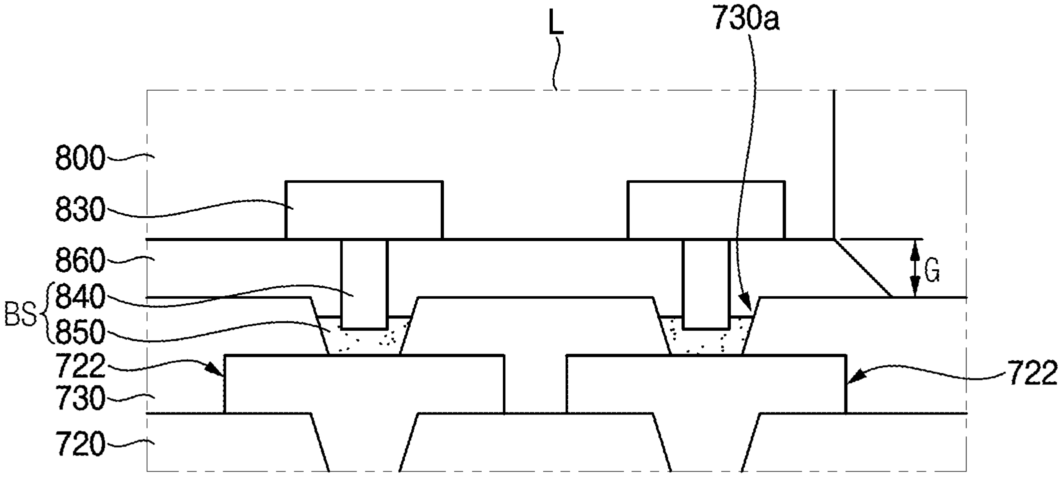
FIG. 34 is an enlarged cross-sectional view illustrating portion 'L' in FIG. 34.

FIG. 33 is a cross-sectional view illustrating a semiconductor package. FIG. 34 is an enlarged cross-sectional view illustrating portion 'L' in FIG. 34. The semiconductor package is substantially the same as the semiconductor package described with reference to FIG. 1 except for an additional second package. Thus, same reference numerals will be used to refer to the same or like elements and any further repetitive explanation concerning the above elements will be omitted.

Referring to FIGS. 33 and 34, a semiconductor package 12 may include a first package and a semiconductor device 800 as a second package stacked on the first package. The first package may include a lower redistribution wiring layer 500, a semiconductor chip 600, a sealing member 400, and an upper redistribution wiring layer 700. The first package may be substantially the same as or similar to the unit package described with reference to FIG. 23. The semiconductor device 800 may include one semiconductor chip or a plurality of stacked semiconductor chips. For example, the semiconductor device 800 may include a high bandwidth memory (HBM) or a stacked chip package.

In some implementations, the semiconductor device 800 may be stacked on the first package using bump structures BS. The semiconductor device 800 may have a plurality of connection pads 830 on a first surface 802 thereof. The semiconductor device 800 may be mounted on the upper redistribution wiring layer 700 such that the surface opposite the first surface 802 on which the connection pads 830 are formed faces the upper redistribution wiring layer 700 of the first package.

The semiconductor device 800 may be mounted on the upper redistribution wiring layer 700 via the bump structures BS. The bump structure BS may be disposed between a second upper redistribution wiring 722, which is an uppermost redistribution wiring of the upper redistribution wiring layer 700 and may electrically connect the semiconductor device 800 and the second redistribution wiring 702.

In some implementations, each of the bump structures BS includes a metal pillar 840 provided on the connection pad 830 and a metal paste 850 coated on one end portion of the metal pillar 840. The metal paste 850 may be provided to cover the end portion of the metal pillar 840. The metal paste 850 may be a copper paste containing copper. The metal paste 850 may include a copper powder and a paste flux. The metal paste 850 may be bonded to the uppermost redistribution wiring of the upper redistribution wiring layer 700 by a sintering process. Accordingly, the metal pillar 840 may be bonded to the uppermost redistribution wiring, e.g., second upper redistribution wiring 722, using the metal paste 850.

The third upper insulating layer 730 as a protective layer may include a recess **730*a* that exposes at least a portion of the uppermost redistribution wiring, e.g., second upper redistribution wiring 722. The recess 730***a* may have a diameter greater than a diameter of the metal pillar 840. The recess 730*a* may accommodate one end portion of the bump structure BS that is formed on the connection pad 830 of the semiconductor device 800. At least a portion of the metal paste 850 covering the end portion of the metal pillar 840 may be accommodated in the recess 730*a*.

Since the metal pillar 840, e.g., a copper pillar, is bonded to the uppermost redistribution wiring by the metal paste 850, e.g., copper paste, the formation of an intermetallic compound (IMC) between the uppermost redistribution writing, e.g., second upper redistribution wiring 722, containing copper and the solder layer may be prevented or suppressed. Additionally, since the end portion of the bump structure BS is disposed within the recess 730*a* of the third upper insulating layer 730, a joint gap G between the upper redistribution wiring layer 700 and the semiconductor device 800 may be reduced.

Accordingly, the connection pad 830 of the semiconductor device 800 may be electrically connected to the uppermost redistribution wiring, e.g., second upper redistribution wiring 722, of the upper redistribution wiring layer 700 by the bump structure BS. An underfill member 860 may be disposed between the semiconductor device 800 and the upper redistribution wiring layer 700.

In some implementations, a heat sink may be provided on the second package to radiate heat from the first and second packages to the outside. The heat sink may be attached to the second package by a thermal interface material (TIM).

The semiconductor package may include semiconductor devices such as logic devices or memory devices. The semiconductor package may include logic devices such as central processing units (CPUs), main processing units (MPUs), or application processors (APs), or the like, and volatile memory devices such as DRAM devices, HBM devices, or non-volatile memory devices such as flash memory devices, PRAM devices, MRAM devices, ReRAM devices, or the like.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination.

The foregoing is illustrative of example embodiments and is not to be construed as limiting thereof. Although a few example embodiments have been described, those skilled in the art will readily appreciate that many modifications are possible In some implementations without materially departing from the novel teachings and advantages of the present invention. Accordingly, all such modifications are intended to be included within the scope of example embodiments as defined in the claims.

What is claimed is:

1. A semiconductor package, comprising:
a semiconductor device including:
a substrate,
bonding pads provided on a front surface of the substrate, and
bump structures provided on the bonding pads respectively, each of the bump structures having a metal pillar and a metal paste coated on an end portion of the metal pillar; and
a wiring layer including:
a metal wiring layer having redistribution pads, and
a protective layer on the metal wiring layer, the protective layer defining recesses that expose at least portions of the redistribution pads,
wherein the semiconductor device is stacked on the wiring layer via the bump structures,
wherein portions of the bump structures are respectively disposed in the recesses of the protective layer, and
wherein the metal paste is bonded to the redistribution pad.

2. The semiconductor package of claim 1, wherein the metal pillars, the metal pastes, and the redistribution pads include copper.

3. The semiconductor package of claim 1, wherein each of the metal pillars has a diameter in a range of 5 μm to 50 μm.

4. The semiconductor package of claim 1, wherein each of the recesses has a diameter in a range of 8 μm to 60 μm.

5. The semiconductor package of claim 1, wherein each of the recesses has a depth in a range of 3 μm to 10 μm from an upper surface of the protective layer.

6. The semiconductor package of claim 1, wherein at least a portion of the metal paste is disposed within the recesses of the protective layer.

7. The semiconductor package of claim 1, wherein a gap between the semiconductor device and the protective layer is in a range of 2 μm to 20 μm.

8. The semiconductor package of claim 1, wherein the metal paste includes a copper powder and a paste flux.

9. The semiconductor package of claim 1, further comprising:
an adhesive layer filling spaces (i) between adjacent bump structures of the bump structures and (ii) between the semiconductor device and an upper wiring layer, the adhesive layer being configured to attach the semiconductor device to the upper wiring layer.

10. A semiconductor package, comprising:
a first semiconductor chip including a first substrate, redistribution pads provided on a first surface of the first substrate, and a protective layer, wherein the protective layer defining recesses that expose at least portions of the redistribution pads;
a second semiconductor chip stacked on the first semiconductor chip, the second semiconductor chip including a second substrate and chip pads provided on a first surface of the second substrate; and
a plurality of bump structures interposed between the first semiconductor chip and the second semiconductor chip,
wherein each of the bump structures includes:
a metal pillar provided on the chip pad of the second semiconductor chip; and
a metal paste coated on an end portion of the metal pillar, and
wherein the metal paste is bonded to the redistribution pad.

11. The semiconductor package of claim 10, wherein portions of the bump structures and at least portions of the metal pastes are respectively disposed in the recesses of the protective layer.

12. The semiconductor package of claim 10, wherein the metal pillars, the metal pastes, and the redistribution pads include copper.

13. The semiconductor package of claim 10, wherein each of the metal pillars has a diameter within a range of 5 μm to 50 μm, wherein each of the recesses has a depth within a range of 3 μm to 10 μm from an upper surface of the protective layer, and wherein a gap between the first semiconductor chip and the protective layer is within a range of 2 μm to 20 μm.

14. The semiconductor package of claim 10, wherein the first semiconductor chip further includes a plurality of through electrodes penetrating the first substrate and bonding pads provided on a second surface of the first substrate opposite to the first surface and electrically connected to the plurality of through electrodes.

15. The semiconductor package of claim 10, further comprising:

an adhesive layer filling spaces between adjacent bump structures of the bump structures and between the first semiconductor chip and the second semiconductor chip.

16. A semiconductor package, comprising:

a lower redistribution wiring layer including first redistribution wirings stacked in at least two layers;

a semiconductor chip disposed on the lower redistribution wiring layer and electrically connected to the first redistribution wirings;

a plurality of bump structures interposed between the lower redistribution wiring layer and the semiconductor chip;

a sealing member covering the semiconductor chip on the lower redistribution wiring layer;

a plurality of through vias penetrating the sealing member and electrically connected to the first redistribution wirings; and an upper redistribution wiring layer disposed on the sealing member and including second redistribution wirings electrically connected to the plurality of through vias, wherein the lower redistribution wiring layer includes an uppermost insulating layer, the uppermost insulating layer defining recesses that expose at least portions of uppermost redistribution wirings among the first redistribution wirings, wherein each of the bump structures includes:

a metal pillar provided on a chip pad of the semiconductor chip; and a metal paste coated on an end portion of the metal pillar, and wherein the metal paste is bonded to the uppermost redistribution wiring of the first redistribution wirings.

17. The semiconductor package of claim 16, wherein portions of the bump structures and at least portions of the metal pastes are respectively disposed within the recesses of the uppermost insulating layer.

18. The semiconductor package of claim 16, wherein the metal pillars, the metal pastes and the uppermost redistribution wirings include copper, and wherein the metal paste includes a copper powder and a paste flux.

19. The semiconductor package of claim 16, wherein each of the metal pillars has a diameter within a range of 5 μm to 50 μm, wherein a gap between the semiconductor chip and the uppermost insulating layer is within a range of 2 μm to 20 μm.

20. The semiconductor package of claim 16, further comprising:

a semiconductor device disposed on the upper redistribution wiring layer; and a plurality of second bump structures interposed between the upper redistribution wiring layer and the semiconductor device, wherein the upper redistribution wiring layer includes an uppermost insulating layer having recesses that expose at least portions of uppermost redistribution wirings among the second redistribution wirings, wherein each of the second bump structures includes:

a metal pillar provided on a connection pad of the semiconductor device; and a metal paste coated on one end portion of the metal pillar, and wherein the metal paste is bonded to the uppermost redistribution wiring of the second redistribution wirings.

* * * * *